US012536957B1

(12) United States Patent
Yan et al.

(10) Patent No.: US 12,536,957 B1
(45) Date of Patent: Jan. 27, 2026

(54) DISPLAY PANEL AND DRIVING METHOD THEREOF

(71) Applicant: Xiamen Tianma Optoelectronics Co., Ltd., Xiamen (CN)

(72) Inventors: Tingting Yan, Shanghai (CN); Zongcai Ding, Xiamen (CN)

(73) Assignee: Xiamen Tianma Optoelectronics Co., Ltd., Xiamen (CN)

( * ) Notice: Subject to any disclaimer, the term of this patent is extended or adjusted under 35 U.S.C. 154(b) by 0 days.

(21) Appl. No.: 18/943,609

(22) Filed: Nov. 11, 2024

(30) Foreign Application Priority Data

Jul. 23, 2024 (CN) ........................ 202410994673.7

(51) Int. Cl.

*G09G 3/36* (2006.01)
*G09G 3/3225* (2016.01)
*G09G 3/3266* (2016.01)
*G11C 19/28* (2006.01)

(52) U.S. Cl.

CPC ......... *G09G 3/3225* (2013.01); *G09G 3/3266* (2013.01); *G11C 19/287* (2013.01); *G09G 2300/0842* (2013.01); *G09G 2300/0861* (2013.01); *G09G 2310/0286* (2013.01); *G09G 2310/08* (2013.01)

(58) Field of Classification Search

CPC ............... G09G 3/3225; G09G 3/3266; G09G 2300/0842; G09G 2300/0861; G09G 2310/0286; G09G 2310/08; G09G 3/3677; G11C 19/287

See application file for complete search history.

(56) References Cited

U.S. PATENT DOCUMENTS

2017/0249916 A1* 8/2017 Jen ....................... G09G 3/3677

FOREIGN PATENT DOCUMENTS

CN 109686334 B 1/2021

* cited by examiner

*Primary Examiner* — Abdul-Samad A Adediran
(74) *Attorney, Agent, or Firm* — Anova Law Group, PLLC

(57) ABSTRACT

The present disclosure provides a display panel and a driving method. The display panel includes a display region, including a plurality of scan lines, and a non-display region. The non-display region includes a first non-display region including a trigger signal line, a plurality of first-clock signal lines from a first first-clock signal line to a k-th first-clock signal line, a plurality of second-clock signal lines from a first second-clock signal line to a k-th second-clock signal line, and n levels of cascaded shift registers; the plurality of first-clock signal lines is electrically connected to k levels of shift registers in sequence, respectively; the plurality of second-clock signal lines is electrically connected to the k levels of shift registers in sequence, respectively; and the trigger signal line is electrically connected to shift registers from a first level to a k-th level and from an (n−k+1)-th level to an n-th-level.

16 Claims, 18 Drawing Sheets

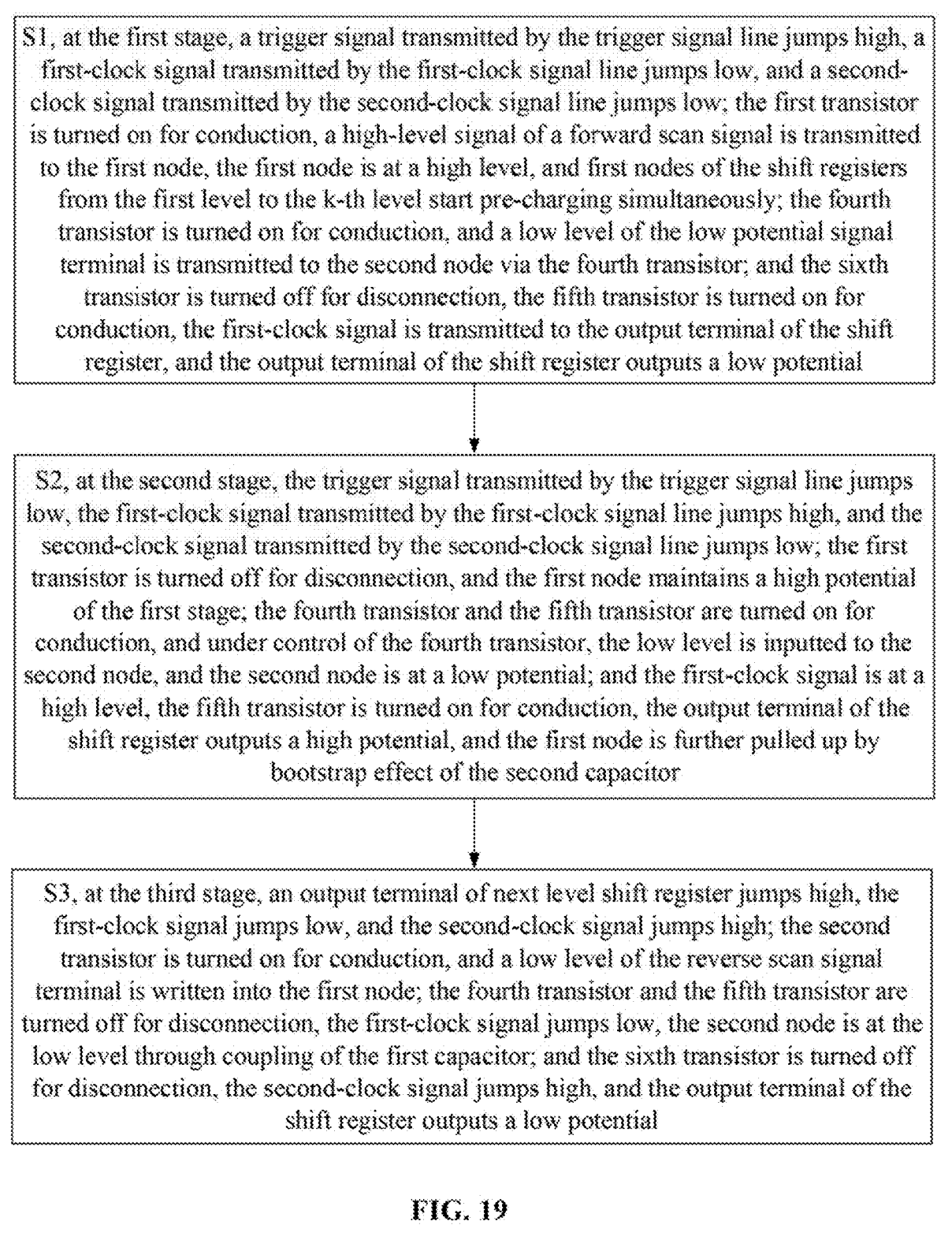

S1, at the first stage, a trigger signal transmitted by the trigger signal line jumps high, a first-clock signal transmitted by the first-clock signal line jumps low, and a second-clock signal transmitted by the second-clock signal line jumps low; the first transistor is turned on for conduction, a high-level signal of a forward scan signal is transmitted to the first node, the first node is at a high level, and first nodes of the shift registers from the first level to the k-th level start pre-charging simultaneously; the fourth transistor is turned on for conduction, and a low level of the low potential signal terminal is transmitted to the second node via the fourth transistor; and the sixth transistor is turned off for disconnection, the fifth transistor is turned on for conduction, the first-clock signal is transmitted to the output terminal of the shift register, and the output terminal of the shift register outputs a low potential

↓

S2, at the second stage, the trigger signal transmitted by the trigger signal line jumps low, the first-clock signal transmitted by the first-clock signal line jumps high, and the second-clock signal transmitted by the second-clock signal line jumps low; the first transistor is turned off for disconnection, and the first node maintains a high potential of the first stage; the fourth transistor and the fifth transistor are turned on for conduction, and under control of the fourth transistor, the low level is inputted to the second node, and the second node is at a low potential; and the first-clock signal is at a high level, the fifth transistor is turned on for conduction, the output terminal of the shift register outputs a high potential, and the first node is further pulled up by bootstrap effect of the second capacitor

↓

S3, at the third stage, an output terminal of next level shift register jumps high, the first-clock signal jumps low, and the second-clock signal jumps high; the second transistor is turned on for conduction, and a low level of the reverse scan signal terminal is written into the first node; the fourth transistor and the fifth transistor are turned off for disconnection, the first-clock signal jumps low, the second node is at the low level through coupling of the first capacitor; and the sixth transistor is turned off for disconnection, the second-clock signal jumps high, and the output terminal of the shift register outputs a low potential

FIG. 19

DISPLAY PANEL AND DRIVING METHOD THEREOF

CROSS-REFERENCE TO RELATED APPLICATION

The present disclosure claims the priority of Chinese Patent Application No. 202410994673.7, filed on Jul. 23, 2024, the content of which is incorporated herein by reference in its entirety.

TECHNICAL FIELD

The present disclosure generally relates to the field of display technology and, more particularly, relates to a display panel and a driving method of the display panel.

BACKGROUND

Liquid crystal displays (LCDs) or organic light-emitting diode (OLED) displays are currently widely used in information products such as laptop computers, personal digital assistants (PDA), flat-screen TVs, mobile phones and the like.

In recent years, in order to decrease the quantity of components and reduce costs, driver circuit structures may be directly formed on the display panels, for example, using gate on array (GOA) technology of integrating gate driver circuits with the liquid crystal panels. Current gate driver circuit may include an amorphous-silicon-gate (ASG) thin-film transistor (TFT); and the gate driver circuit may output scan signals to drive the display panel.

In the existing technology, by increasing clock signal lines (CLK lines), the pre-charging and charging time of the ASG circuits may increase, and the pre-charging time of the pixels may also increase, which can improve the display effect of a display apparatus. However, for existing connection manner, same quantity of start signal lines (STV lines) may need to increase correspondingly when the CLK lines increase. Increased quantity of start signal lines may occupy the space of the non-display region, which may be not beneficial for narrow frame trend of the display apparatus.

Therefore, there is a need to provide a display panel and a driving method of the display panel that may ensure pre-charging and charging time and achieve narrow frame.

One aspect of the present disclosure provides a display panel. The display panel includes a display region and a non-display region at least partially surrounding the display region. The display region includes a plurality of scan lines; the non-display region includes a first non-display region; and the first non-display region includes a trigger signal line, a plurality of first-clock signal lines from a first first-clock signal line to a k-th first-clock signal line, a plurality of second-clock signal lines from a first second-clock signal line to a k-th second-clock signal line, and n levels of cascaded shift registers; output terminals of the n levels of cascaded shift registers are electrically connected to the plurality of scan lines in a one-to-one correspondence, and an output terminal of an m-th-level shift register is electrically connected to a first terminal of an (m+k)-th-level shift register; the plurality of first-clock signal lines from the first first-clock signal line to the k-th first-clock signal line is electrically connected to k levels of shift registers in sequence, respectively; the plurality of second-clock signal lines from the first second-clock signal line to the k-th second-clock signal line is electrically connected to the k levels of shift registers in sequence, respectively; and the trigger signal line is electrically connected to shift registers from a first level to a k-th level and shift registers from an (n−k+1)-th level to an n-th-level, where k is a positive integer greater than or equal to 1, n is a positive integer greater than k, m is a positive integer greater than or equal to 1, and m+k≤n.

Another aspect of the present disclosure provides a driving method of a display panel. The display panel includes a display region and a non-display region at least partially surrounding the display region, where the display region includes a plurality of scan lines; the non-display region includes a trigger signal line, a plurality of first-clock signal lines from a first first-clock signal line to a k-th first-clock signal line, a plurality of second-clock signal lines from a first second-clock signal line to a k-th second-clock signal line, and n levels of cascaded shift registers; output terminals of the n levels of cascaded shift registers are electrically connected to the plurality of scan lines in a one-to-one correspondence, and an output terminal of an m-th-level shift register is electrically connected to a first terminal of an (m+k)-th-level shift register; the plurality of first-clock signal lines from the first first-clock signal line to the k-th first-clock signal line is connected to k levels of shift registers in sequence, respectively; the plurality of second-clock signal lines from the first second-clock signal line to the k-th second-clock signal line is connected to the k levels of shift registers in sequence, respectively; and the trigger signal line is connected to shift registers from a first level to a k-th level and shift registers from an (n−k+1)-th level to an n-th-level, where k is a positive integer greater than or equal to 1, n is a positive integer greater than k, m is a positive integer greater than or equal to 1, and m+k≤n. The method includes forward scanning or reverse scanning, where during the forward scanning, pre-charging start time points of the shift registers from the first level to the k-th level are same; and during the reverse scanning, pre-charging start time points of the shift registers from the (n−k+1)-th level to the n-th level are same.

Other aspects of the present disclosure may be understood by those skilled in the art in light of the description, the claims, and the drawings of the present disclosure.

BRIEF DESCRIPTION OF THE DRAWINGS

The accompanying drawings, which are incorporated into a part of the specification, illustrate embodiments of the present disclosure and together with the description to explain the principles of the present disclosure.

FIG. 19 illustrates another flowchart of a driving method of a display panel according to various embodiments of the present disclosure.

DETAILED DESCRIPTION

Various exemplary embodiments of the present disclosure are described in detail with reference to accompanying drawings. It should be noted that relative arrangement of parts and steps, numerical expressions and numerical values described in exemplary embodiments do not limit the scope of the present disclosure unless otherwise specifically stated.

The following description of at least one exemplary embodiment may be merely illustrative and may not be intended to limit the present disclosure and its application or use.

The technologies, methods and apparatuses known to those skilled in the art may not be discussed in detail, but where appropriate, the technologies, methods and apparatuses should be considered as a part of the present disclosure.

In all examples shown and discussed herein, any specific value should be interpreted as merely exemplary and not as a limitation. Therefore, other examples of the exemplary embodiments may have different values.

It should be noted that similar numbers and letters represent similar items in accompanying drawings. Therefore, once an item is defined in one drawing, it may not need to be further discussed in subsequent drawings.

Figure 1:
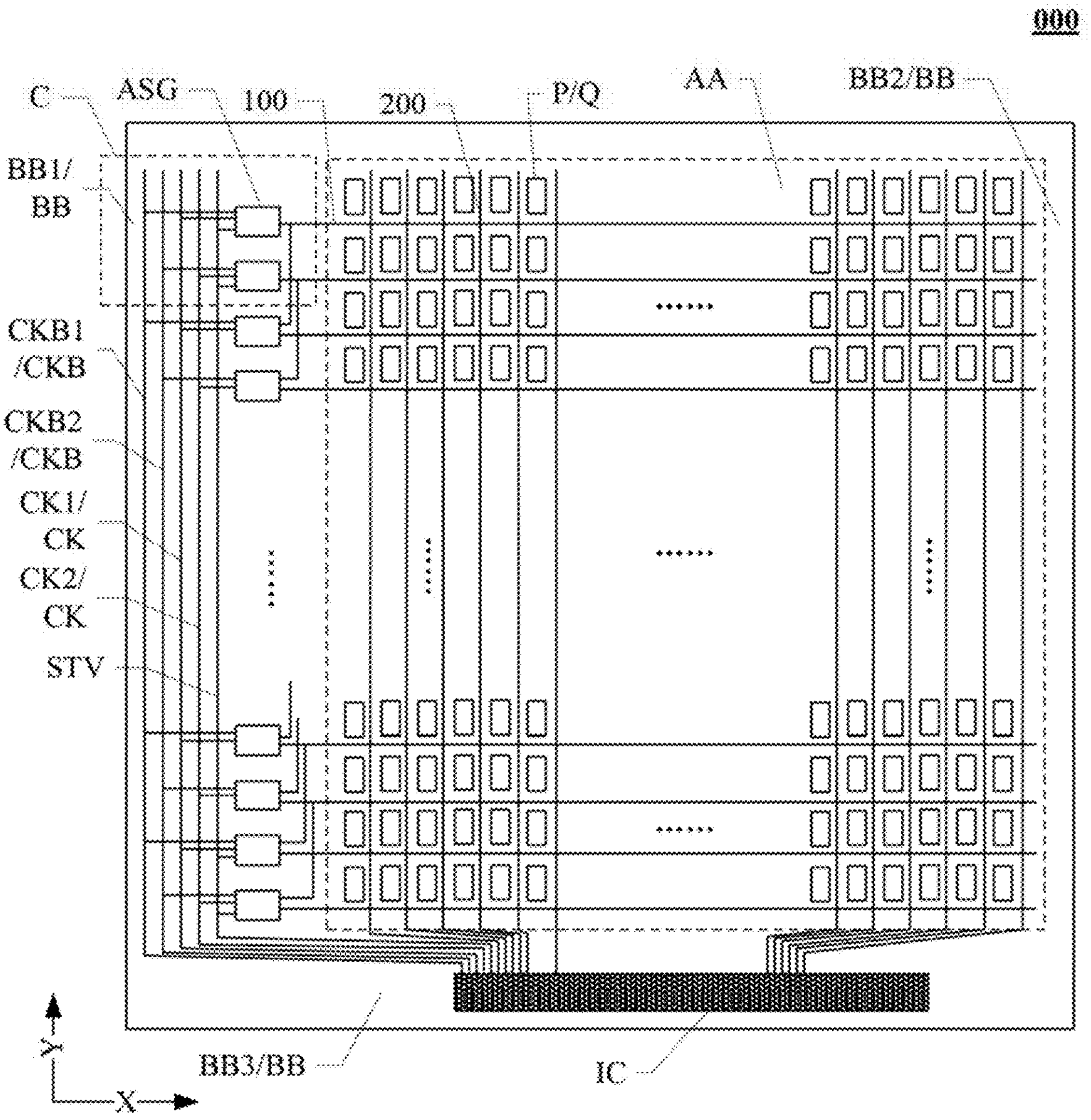
FIG. 1 illustrates a planar structural schematic of a display panel according to various embodiments of the present disclosure.

FIG. 1 illustrates a planar structural schematic of a display panel according to various embodiments of the present disclosure. Referring to FIG. 1, a display panel 000 provided in one embodiment may include a display region AA and a non-display region BB at least partially surrounding the display region AA. The display region AA may include a plurality of scan lines 100. The non-display region BB may include the first non-display region BB1. The first non-display region BB1 may include a trigger signal line STV, a plurality of first-clock signal lines CKB from the first first-clock signal line CKB to the k-th first-clock signal line CKB, a plurality of second-clock signal lines CK from the first second-clock signal line CK to the k-th second-clock signal line CK, and n levels of cascaded shift registers ASG. The output terminals of the shift registers ASG may be electrically connected to the scan lines 100 in one-to-one correspondence. The output terminal of the m-th-level shift register ASG may be electrically connected to the first terminal of the (m+k)-th-level shift register ASG. The plurality of first-clock signal lines CKB from the first first-clock signal line CKB to the k-th first-clock signal line CKB may be electrically connected to k levels of shift registers ASG in sequence, respectively. The plurality of second-clock signal lines CK from the first second-clock signal line CK to the k-th second-clock signal line CK may be electrically connected to k levels of shift registers ASG in sequence, respectively. The trigger signal line STV may be electrically connected to the shift registers ASG from the first level to the k-th level, and the shift registers ASG from the (n−k+1)-th level to the n-th level, where k may be a positive integer greater than or equal to 1, n may be a positive integer greater than k, m may be a positive integer greater than or equal to 1, and m+k≤n.

Figure 2:
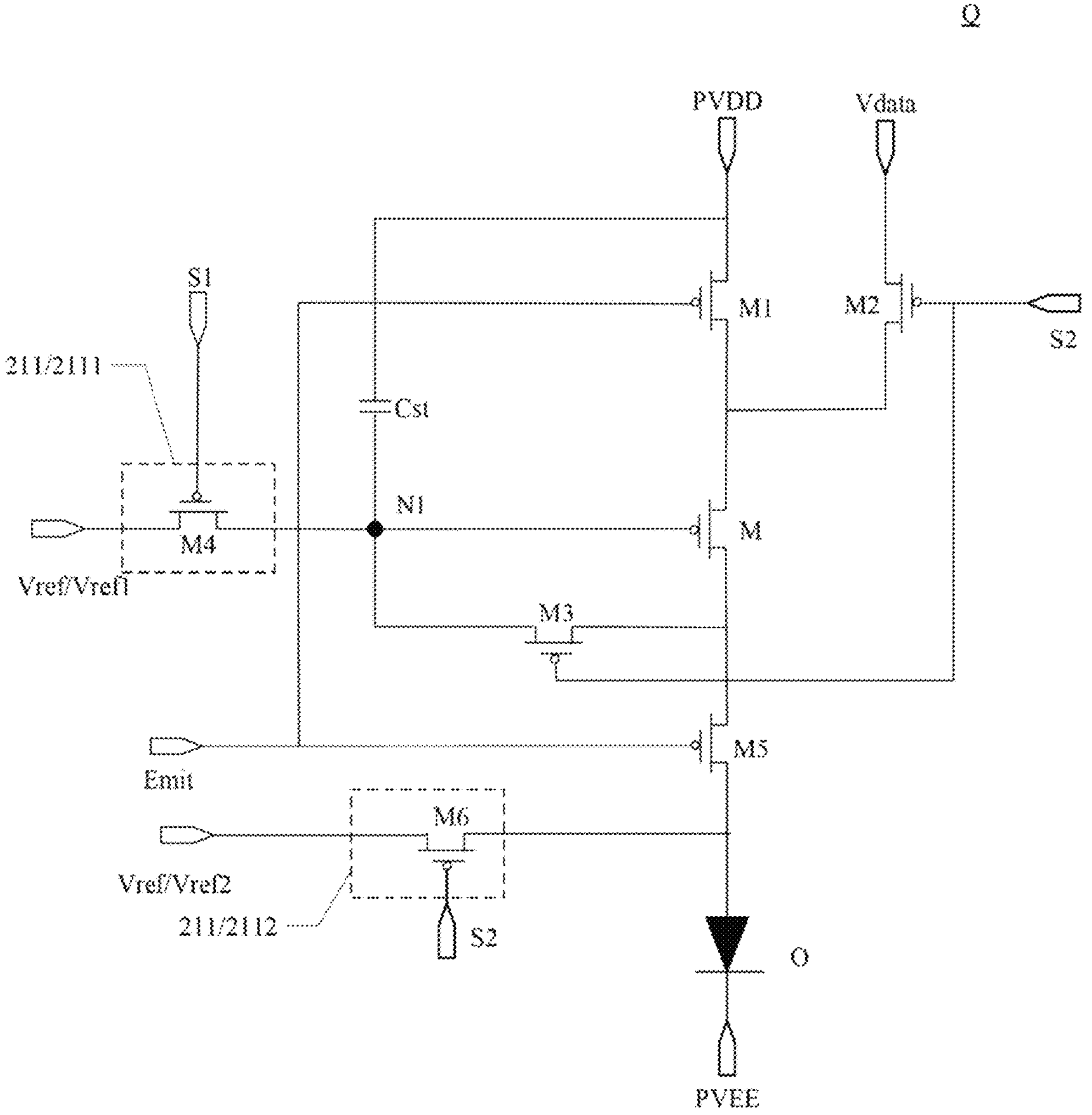
FIG. 2 illustrates a structural schematic of a pixel driver circuit according to various embodiments of the present disclosure.

For example, the display panel 000 of the present disclosure may be either a liquid crystal display panel or an organic self-luminous display panel, which may not be limited herein. FIG. 1 only shows the case that the non-display region BB completely surrounds the display region AA. Obviously, the non-display region BB may also partially surround the display region AA, which may not be limited herein. The non-display region BB may include the first non-display region BB1 and the second non-display region BB2 that are arranged oppositely along the first direction X. The first non-display region BB1 may be a left frame, and the second non-display region BB2 may be a right frame. The display region AA may include the scan lines 100 extending along the first direction X and arranged along the second direction Y, and the data lines 200 extending along the first direction X and arranged along the second direction Y. The pixels P may be arranged in the intersecting regions of the scan lines 100 and the data lines 200; the pixel driver circuits Q may be configured in the pixels P; and the data lines 200 may be electrically connected to the driving chip IC in the third non-display region BB3. FIG. 1 schematically shows that the n levels of gate driver circuit may be arranged in the first non-display region BB1, and the scan signals outputted by the gate driver circuits may drive the pixel driver circuits Q in the display region AA. The pixel driver circuit Q may refer to FIG. 2. FIG. 2 illustrates a structural schematic of the pixel driver circuit Q according to various embodiments of the present disclosure. The pixel driver circuit Q may be 7T1C. The pixel driver circuit Q may include a transistor M1 where the control terminal may be electrically connected to a light-emitting signal input terminal, the first terminal may be electrically connected to a power signal terminal PVDD, and the second terminal may be electrically connected to the first terminal of a driving transistor M; a transistor M2 where the control terminal may be electrically connected to a second scan signal input terminal S2, the first terminal may be electrically connected to a data signal input terminal Vdata, and the second terminal may be electrically connected to the first terminal of the driving transistor M; the driving transistor M, where the control terminal may be electrically connected to the second terminal of a transistor M4, and the first terminal may be electrically connected to the second terminal of the transistor M1 and the second terminal of the transistor M2; a transistor M3 where the control terminal may be electrically connected to the second scan signal input terminal S2, the first terminal may be electrically connected to the second terminal of the transistor M4 and the second terminal of a storage capacitor Cst, and the second terminal may be electrically connected to the second terminal of the driving transistor M and the first terminal of a transistor M5; the transistor M4 where the control terminal may be electrically connected to the first scan signal input terminal S1, the first terminal may be electrically connected to a reference voltage signal input terminal Vref, and the second terminal may be electrically connected to the control terminal of the driving transistor M; the transistor M5 where the control terminal may be electrically connected to a light-emitting signal input terminal Emit, the first terminal may be electrically connected to the second terminal of the driving transistor M and the second terminal of the transistor M3, and the second terminal may be electrically connected to an anode of a light-emitting element O; a transistor M6 where the control terminal may be electrically connected to the second scan signal input terminal, the first terminal may be electrically connected to the reference voltage signal input terminal Vref, and the second terminal may be electrically connected to a first terminal of the light-emitting element O; the light emitting element O where the first terminal may be electrically connected to the second terminal of the transistor M5 and the second terminal of the transistor M6, and the second terminal may be electrically connected to the second power signal terminal PVEE; and the storage capacitor Cst where the first terminal may be electrically connected to the first power signal terminal PVDD, and the second terminal may be electrically connected to the control terminal of the driving transistor M, the first terminal of the transistor M3 and the second terminal of the transistor M4.

In FIG. 1, k=2 may be configured as a schematic illustration. The first non-display region BB1 may include 1 trigger signal line STV, 2 first-clock signal lines CKB, 2 second-clock signal lines CK, and n levels of cascaded shift registers ASG. Taking n as an even number as an example, the first-clock signal lines CKB from the first first-clock signal line CKB to the second first-clock signal line CKB may be electrically connected to the 2 levels of shift registers ASG in sequence, and the second-clock signal lines CK2 from the first second-clock signal line CK2 to the second second-clock signal line CK2 may be electrically connected to the 2 levels of shift registers ASG in sequence; and specific connections are described in detail hereinafter.

The first level shift register ASG may be electrically connected to the first first-clock signal line CKB1 and the first second-clock signal line CK1; the first first-clock signal line CKB1 and the first second-clock signal line CK1 may send the first-clock signal and the second-clock signal to the first level shift register ASG; and the output terminal of the first level shift register ASG may be connected to the first terminal of the third level shift register ASG, and the output terminal of the first level shift register ASG may be electrically connected to the first scan line 100.

The second level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the second level shift register ASG; and the output terminal of the second level shift register ASG may be electrically connected to the first terminal of the fourth level shift register ASG, and the output terminal of the second level shift register ASG may be electrically connected to the second scan line 100.

The third level shift register ASG may be electrically connected to the first first-clock signal line CKB1 and the first second-clock signal line CK1; the first first-clock signal line CKB1 and the first second-clock signal line CK1 may send the first-clock signal and the second-clock signal to the third level shift register ASG; and the output terminal of the third level shift register ASG may be electrically connected to the first terminal of the 5th-level shift register ASG, and the output terminal of the third level shift register ASG may be electrically connected to the third scan line 100.

The fourth level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the fourth level shift register ASG; the output terminal of the fourth level shift register ASG may be electrically connected to the first terminal of the sixth level shift register ASG, and the output terminal of the fourth level shift register ASG may be electrically connected to the fourth scan line 100.

The same/similar arrangement may be applied to all shift registers, e.g., the fifth, the sixth, till the n-th-level shift register ASG.

The (n−3)-th-level shift register ASG may be electrically connected to the first first-clock signal line CKB1 and the first second-clock signal line CK1; the first first-clock signal line CKB1 and the first second-clock signal line CK1 may send the first-clock signal and the second-clock signal to the (n−3)-th-level shift register ASG; and the output terminal of the (n−3)-th-level shift register ASG may be electrically connected to the first terminal of the (n−1)-th first shift register ASG, and the output terminal of the (n−3)-th-level shift register ASG may be electrically connected to the (n−3)-th scan line 100.

The (n−2)-th-level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the (n−2)-th-level shift register ASG; and the output terminal of the (n−2)-th-level shift register ASG may be electrically connected to the first terminal of the n th-level shift register ASG, and the output terminal of the (n−2)-th-level shift register ASG may be electrically connected to the (n−2)-th scan line 100.

The (n−1)-th-level shift register ASG may be electrically connected to the first first-clock signal line CKB1 and the first second-clock signal line CK1; the first first-clock signal line CKB1 and the first second-clock signal line CK1 may send the first-clock signal and the second-clock signal to the (n−1)-th-level shift register ASG; and the output terminal of the (n−1)-th-level shift register ASG may be electrically connected to the (n−1)-th scan line 100.

The n-th-level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the n-th-level shift register ASG; and the output terminal of the n th-level shift register ASG may be electrically connected to the n-th scan line 100.

Compared with the existing technology, the display panel in one embodiment may at least have the following beneficial effects.

The first non-display region BB1 may be configured with the first-clock signal lines CKB from the first first-clock signal line to the k-th first-clock signal line, and the second-clock signal lines CK from the first second-clock signal line to the k-th second-clock signal line. The first-clock signal lines CKB from the first first-clock signal line to the k-th first-clock signal line may be electrically connected to the k levels of shift registers ASG in sequence, respectively; and the second-clock signal lines CK from the first second-clock signal line to the k-th second-clock signal line may be electrically connected to the k levels of shift registers ASG in sequence, respectively. By sequentially generating the scan signals through the quantity k of first-clock signal lines CKB and the quantity k of second-clock signal lines CK, the pre-charging time and charging time may be increased, and furthermore the pre-charging time of the pixels P in the display region AA may be also increased, thereby improving the reliability of the display panel.

Only one trigger signal line STV may be configured in the first non-display region BB1, and the trigger signal line STV may be electrically connected to the shift registers ASG from the first level to the k-th level, and the shift registers ASG from the (n−k+1)-th level to the n-th level. During forward scanning, the trigger signal line STV may send the trigger signal to the shift registers ASG from the first level to the k-th level; during reverse scanning, the trigger signal line STV may send the trigger signal to the shift registers ASG from the (n−k+1)-th level to the n-th level; and the shift registers ASG may send the scan signals to the scan lines 100. In the existing technology, when the quantity k of first-clock signal lines CKB and the quantity k of second-clock signal lines CK are configured, equal quantity of trigger signal lines STV may be needed, that is, the quantity k of trigger signal lines STV may be needed. Since the quantity k of trigger signal lines STV occupy the space of the first non-display region BB1, it is not beneficial for the narrow frame of the first non-display region BB1. Only one trigger signal line STV is configured in the first non-display region BB1 in the present disclosure. Therefore, the space may be further saved, and the first non-display region BB1 may be reduced to achieve narrow frame. The present disclosure may achieve narrow frame under the premise of ensuring pre-charging and charging time.

Figure 3:
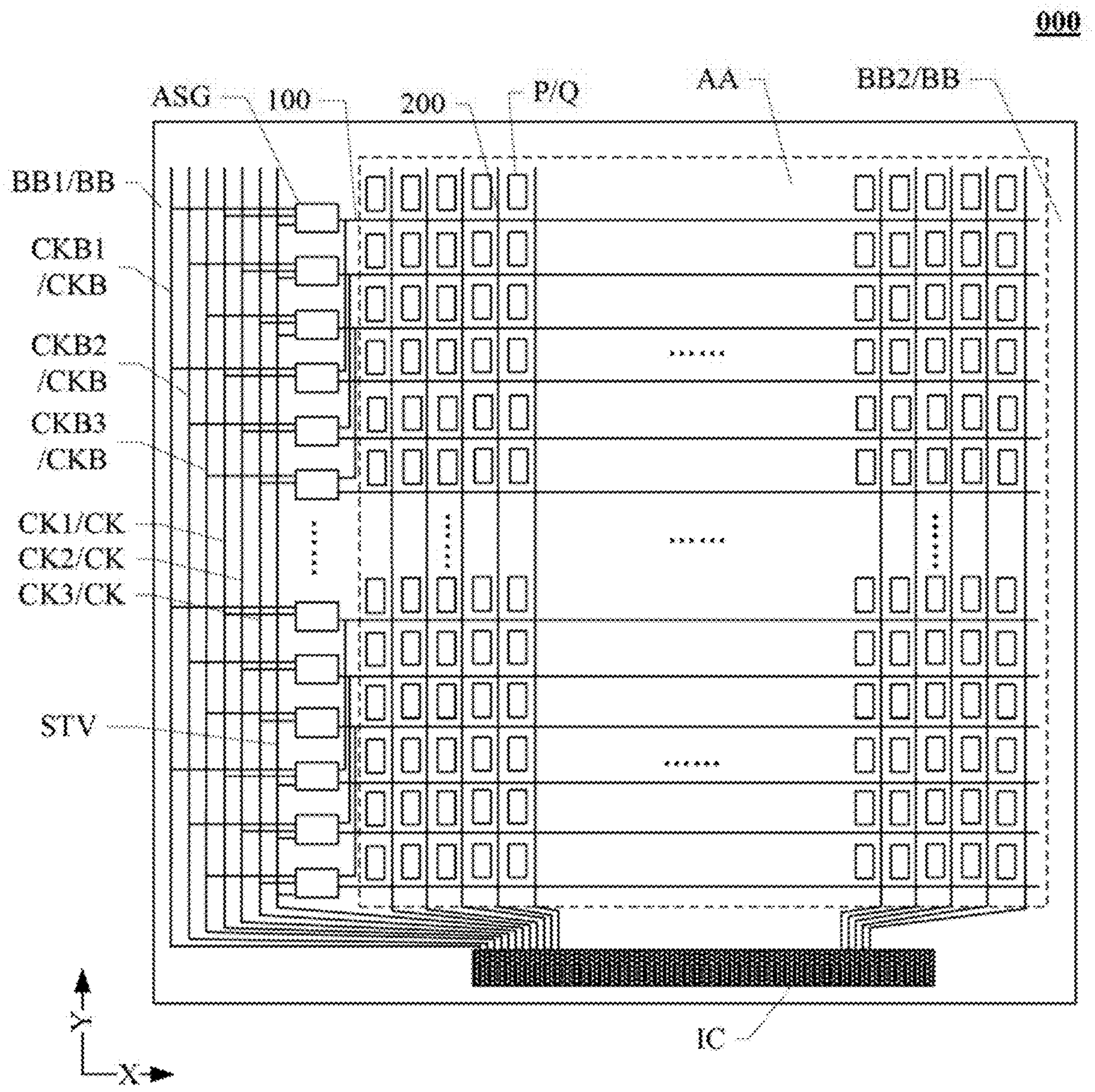
FIG. 3 illustrates another planar structural schematic of a display panel according to various embodiments of the present disclosure.
Figure 4:
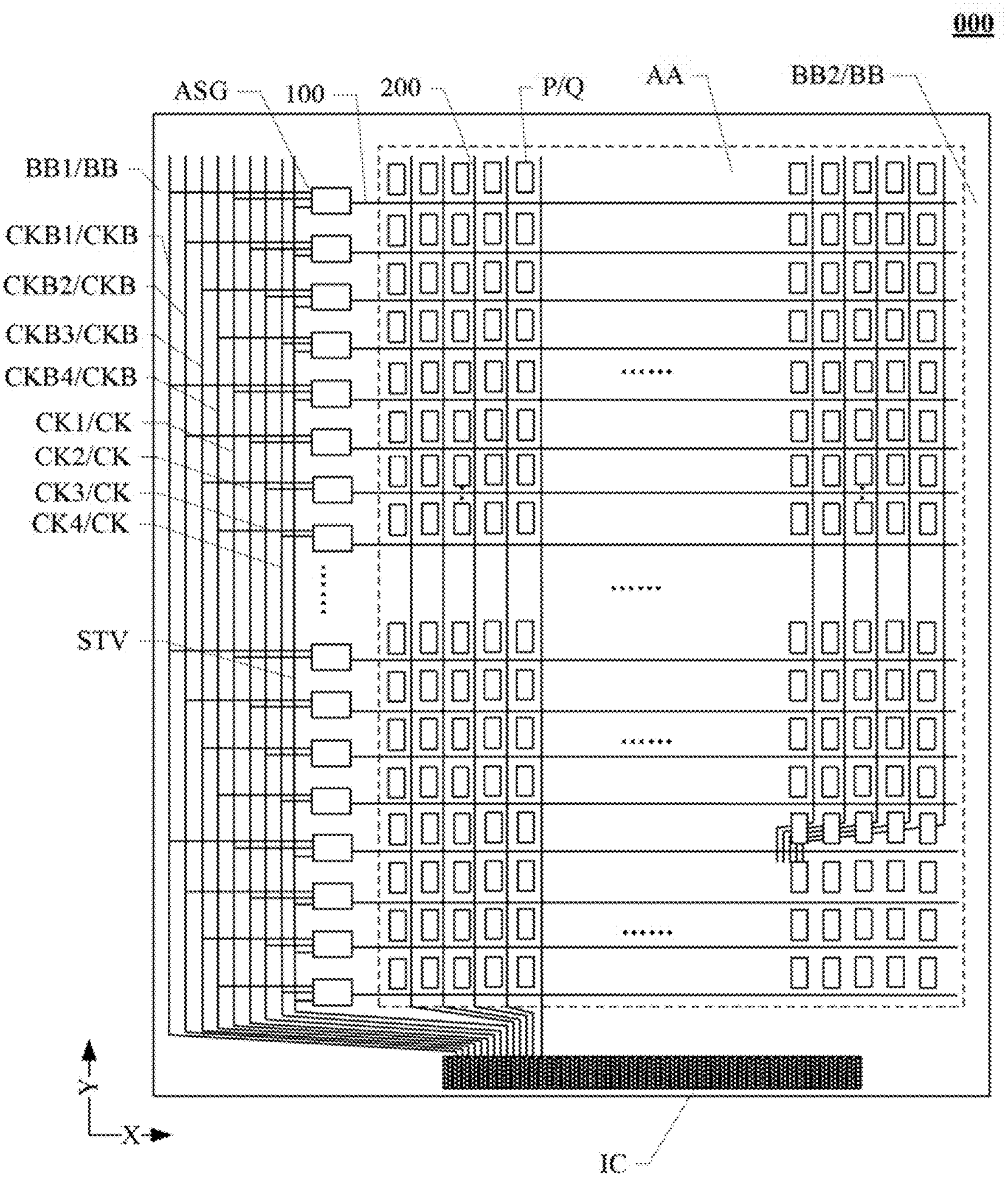
FIG. 4 illustrates another planar structural schematic of a display panel according to various embodiments of the present disclosure.

In some optional embodiments, referring to FIGS. 1, 3 and 4, FIG. 3 illustrates another planar structural schematic of a display panel according to various embodiments of the present disclosure; and FIG. 4 illustrates another planar structural schematic of a display panel according to various embodiments of the present disclosure. K=2, 3 or 4.

In FIG. 1, k=2; in FIG. 3, k=3; and in FIG. 4, k=4.

As shown in FIG. 3, the first non-display region BB1 may include 1 trigger signal line STV, 3 first-clock signal lines CKB, 3 second-clock signal lines CK, and n levels of cascaded shift registers ASG. Taking n as a multiple of 3 as an example, the first to third first-clock signal lines CKB may be electrically connected to 3 levels of shift registers ASG in sequence, and the first to third second-clock signal lines CK3 may be electrically connected to 3 levels of shift registers ASG in sequence; and specific connections are described in detail hereinafter.

The first level shift register ASG may be electrically connected to the first first-clock signal line CKB1 and the first second-clock signal line CK1; the first first-clock signal line CKB1 and the first second-clock signal line CK1 may send the first-clock signal and the second-clock signal to the first level shift register ASG; and the output terminal of the first level shift register ASG may be electrically connected to the first terminal of the fourth level shift register ASG, and the output terminal of the first level shift register ASG may be also electrically connected to the first scan line 100.

The second level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the second level shift register ASG; and the output terminal of the second level shift register ASG may be electrically connected to the first terminal of the fifth level shift register ASG, and the output terminal of the second level shift register ASG may be also electrically connected to the second scan line 100.

The third level shift register ASG may be electrically connected to the third first-clock signal line CKB3 and the third second-clock signal line CK3; the third first-clock signal line CKB3 and the third second-clock signal line CK3 may send the first-clock signal and the second-clock signal to the third level shift register ASG; and the output terminal of the third level shift register ASG may be electrically connected to the first terminal of the sixth level shift register ASG, and the output terminal of the third level shift register ASG may be also electrically connected to the third scan line 100.

The fourth level shift register ASG may be electrically connected to the first first-clock signal line CKB1 and the first second-clock signal line CK1; the first first-clock signal line CKB1 and the first second-clock signal line CK1 may send the first-clock signal and the second-clock signal to the fourth level shift register ASG; and the output terminal of the fourth level shift register ASG may be electrically connected to the first terminal of the seventh level shift register ASG, and the output terminal of the fourth level shift register ASG may be also electrically connected to the fourth scan line 100.

The fifth level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the fifth level shift register ASG; and the output terminal of the 5th-level shift register ASG may be electrically connected to the first terminal of the eighth level shift register ASG, and the output terminal of the fifth level shift register ASG may be also electrically connected to the fifth scan line 100.

The sixth level shift register ASG may be electrically connected to the third first-clock signal line CKB3 and the third second-clock signal line CK3; the third first-clock signal line CKB3 and the third second-clock signal line CK3 may send the first-clock signal and the second-clock signal to the sixth level shift register ASG; the output terminal of the sixth level shift register ASG may be electrically connected to the first terminal of the ninth level shift register ASG, and the output terminal of the sixth level shift register ASG may be also electrically connected to the sixth scan line 100.

The same/similar arrangement may be applied to all shift registers, e.g., the seventh, the eighth, till the n-th-level shift register ASG.

The (n−5)-th-level shift register ASG may be electrically connected to the first first-clock signal line CKB1 and the first second-clock signal line CK1; the first first-clock signal line CKB1 and the first second-clock signal line CK1 may send the first-clock signal and the second-clock signal to the (n−5)-th-level shift register ASG; and the output terminal of the (n−5)-th-level shift register ASG may be electrically connected to the first terminal of the (n−2)-th-level shift register ASG, and the output terminal of the (n−5)-th-level shift register ASG may be also electrically connected to the (n−5)-th scan line 100.

The (n−4)-th-level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the (n−4)-th-level shift register ASG; and the output terminal of the (n−4)-th-level shift register ASG may be electrically connected to the first terminal of the (n−1)-th-level shift register ASG, and the output terminal of the (n−4)-th-level shift register ASG may be electrically connected to the (n−4)-th scan line 100.

The (n−3)-th-level shift register ASG may be electrically connected to the third first-clock signal line CKB3 and the third second-clock signal line CK3; the third first-clock signal line CKB3 and the third second-clock signal line CK3 may send the first-clock signal and the second-clock signal to the (n−3)-th-level shift register ASG; and the output terminal of the (n−3)-th-level shift register ASG may be electrically connected to the first terminal of the n-th-level shift register ASG, and the output terminal of the (n−3)-th-level shift register ASG may be electrically connected to the (n−3)-th scan line 100.

The (n−2)-th-level shift register ASG may be electrically connected to the first first-clock signal line CKB1 and the first second-clock signal line CK1; the first first-clock signal line CKB1 and the first second-clock signal line CK1 may send the first-clock signal and the second-clock signal to the (n−2)-th-level shift register ASG; and the output terminal of the (n−2)-th-level shift register ASG may be electrically connected to the (n−2)-th scan line 100.

The (n−1)-th-level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the (n−1)-th-level shift register ASG; and the output terminal of the (n−1)-th-level shift register ASG may be electrically connected to the (n−1)-th scan line 100.

The n-th-level shift register ASG may be electrically connected to the third first-clock signal line CKB3 and the third second-clock signal line CK3; the third first-clock signal line CKB3 and the third second-clock signal line CK3 may send the first-clock signal and the second-clock signal to the n-th-level shift register ASG; and the output terminal of the n-th-level shift register ASG may be electrically connected to the n-th scan line 100.

Referring to FIG. 3, in the existing technology, when three first-clock signal lines CKB and three second-clock signal lines CK are configured, equal quantity of trigger signal lines STV may be needed, that is, three trigger signal lines STV may be needed. Since three trigger signal lines STV occupy the space of the first non-display region BB1, it is not beneficial for the narrow frame of the first non-display region BB1. Only one trigger signal line STV is configured in the first non-display region BB1 in one embodiment. Therefore, the space may be further saved, and the first non-display region BB1 may be reduced to achieve narrow frame, which may achieve narrow frame under the premise of ensuring the pre-charging and charging time.

As shown in FIG. 4, the first non-display region BB1 may include 1 trigger signal line STV, 4 first-clock signal lines CKB, 4 second-clock signal lines CK, and n levels of cascaded shift registers ASG. Taking n as a multiple of 4 as an example, the first to fourth first-clock signal lines CKB may be electrically connected to 4 levels of shift registers ASG in sequence, and the first to fourth second-clock signal lines CK4 may be electrically connected to 4 levels of shift registers ASG in sequence; and specific connections are described in detail hereinafter.

The first level shift register ASG may be electrically connected to the first first-clock signal line CKB1 and the first second-clock signal line CK1; the first first-clock signal line CKB1 and the first second-clock signal line CK1 may send the first-clock signal and the second-clock signal to the first level shift register ASG; and the output terminal of the first level shift register ASG may be electrically connected to the first terminal of the fifth level shift register ASG, and the output terminal of the first level shift register ASG may be also electrically connected to the first scan line 100.

The second level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the second level shift register ASG; and the output terminal of the second level shift register ASG may be electrically connected to the first terminal of the sixth level shift register ASG, and the output terminal of the second level shift register ASG may be also electrically connected to the second scan line 100.

The third level shift register ASG may be electrically connected to the third first-clock signal line CKB3 and the third second-clock signal line CK3; the third first-clock signal line CKB3 and the third second-clock signal line CK3 may send the first-clock signal and the second-clock signal to the third level shift register ASG; and the output terminal of the third level shift register ASG may be electrically connected to the first terminal of the seventh level shift register ASG, and the output terminal of the third level shift register ASG may be also electrically connected to the third scan line 100.

The fourth level shift register ASG may be electrically connected to the fourth first-clock signal line CKB4 and the fourth second-clock signal line CK4; the fourth first-clock signal line CKB4 and the fourth second-clock signal line CK4 may send the first-clock signal and the second-clock signal to the fourth level shift register ASG; and the output terminal of the fourth level shift register ASG may be electrically connected to the first terminal of the eighth level shift register ASG, and the output terminal of the fourth level shift register ASG may be also electrically connected to the fourth scan line 100.

The fifth level shift register ASG may be electrically connected to the first first-clock signal line CKB1 and the first second-clock signal line CK1; the first first-clock signal line CKB1 and the first second-clock signal line CK1 may send the first-clock signal and the second-clock signal to the fifth level shift register ASG; and the output terminal of the fifth level shift register ASG may be electrically connected to the first terminal of the ninth level shift register ASG, and the output terminal of the fifth level shift register ASG may be also electrically connected to the fifth scan line 100.

The sixth level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the sixth level shift register ASG; and the output terminal of the sixth level shift register ASG may be electrically connected to the first terminal of the tenth level shift register ASG, and the output terminal of the sixth level shift register ASG may be also electrically connected to the sixth scan line 100.

The same/similar arrangement may be applied to all shift registers, e.g., the seventh, the eighth, till the n-th-level shift register ASG.

The (n−7)-th-level shift register ASG may be electrically connected to the first first-clock signal line CKB1 and the first second-clock signal line CK1; the first first-clock signal line CKB1 and the first second-clock signal line CK1 may send the first-clock signal and the second-clock signal to the (n−7)-th-level shift register ASG; and the output terminal of the (n−7)-th-level shift register ASG may be electrically connected to the first terminal of the (n−3)-th-level shift register ASG, and the output terminal of the (n−7)-th-level shift register ASG may be also electrically connected to the (n−7)-th scan line 100.

The (n−6)-th-level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the (n−6)-th-level shift register ASG; and the output terminal of the (n−6)-th-level shift register ASG may be electrically connected to the first terminal of the (n−2)-th-level shift register ASG, and the output terminal of the (n−6)-th-level shift register ASG may be also electrically connected to the (n−6)-th scan line 100.

The (n−5)-th-level shift register ASG may be electrically connected to the third first-clock signal line CKB3 and the third second-clock signal line CK3; the third first-clock signal line CKB3 and the third second-clock signal line CK3 may send the first-clock signal and the second-clock signal to the (n−5)-th-level shift register ASG; and the output terminal of the (n−5)-th-level shift register ASG may be electrically connected to the first terminal of the (n−1)-th-level shift register ASG, and the output terminal of the (n−5)-th-level shift register ASG may be also electrically connected to the (n−5)-th scan line 100.

The (n−4)-th-level shift register ASG may be electrically connected to the fourth first-clock signal line CKB4 and the fourth second-clock signal line CK4; the fourth first-clock signal line CKB4 and the fourth second-clock signal line CK4 may send the first-clock signal and the second-clock signal to the (n−4)-th-level shift register ASG; and the output terminal of the (n−4)-th-level shift register ASG may be electrically connected to the first terminal of the n th-level shift register ASG, and the output terminal of the (n−4)-th-level shift register ASG may be also electrically connected to the (n−4)-th scan line 100.

The (n−3)-th-level shift register ASG may be electrically connected to the first first-clock signal line CKB1 and the first second-clock signal line CK1; the first first-clock signal line CKB1 and the first second-clock signal line CK1 may send the first-clock signal and the second-clock signal to the (n−3)-th-level shift register ASG; and the output terminal of the (n−3)-th-level shift register ASG may be electrically connected to the (n−3)-th scan line 100.

The (n−2)-th-level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the (n−2)-th-level shift register ASG; and the output terminal of the (n−2)-th-level shift register ASG may be electrically connected to the (n−2)-th-level scan line 100.

The (n−1)-th-level shift register ASG may be electrically connected to the third first-clock signal line CKB3 and the third second-clock signal line CK3; the third first-clock signal line CKB3 and the third second-clock signal line CK3 may send the first-clock signal and the second-clock signal to the (n−1)-th-level shift register ASG; and the output terminal of the (n−1)-th-level shift register ASG may be electrically connected to the (n−1)-th scan line 100.

The n-th-level shift register ASG may be electrically connected to the fourth first-clock signal line CKB4 and the fourth second-clock signal line CK4; the fourth first-clock signal line CKB4 and the fourth second-clock signal line CK4 may send the first-clock signal and the second-clock signal to the n-th-level shift register ASG; and the output terminal of the n-th-level shift register ASG may be electrically connected to the n-th scan line 100.

Referring to FIG. 4, in the existing technology, when 4 first-clock signal lines CKB and 4 second-clock signal lines CK are configured, equal quantity of trigger signal lines STV may be needed, that is, 4 trigger signal lines STV may be needed. Since the 4 trigger signal lines STV occupy the space of the first non-display region BB1, it is not beneficial for the narrow frame of the first non-display region BB1. Only one trigger signal line STV is configured in the first non-display region BB1 in one embodiment. Therefore, the space may be further saved, and the first non-display region BB1 may be reduced to achieve narrow frame, which may achieve narrow frame under the premise of ensuring the pre-charging and charging time.

In some optional embodiments, referring to FIGS. 1, 3 and 4, the trigger signal line STV may be directly and electrically connected to the shift registers ASG from the first level to the k-th-level, and the shift registers ASG from the (n−k+1)-th level to the n-th level.

In one embodiment, as shown in FIG. 1, 1 trigger signal line STV may be directly and electrically connected to the shift registers ASG from the first level to the second level; and the trigger signal line STV may be also directly and electrically connected to the shift registers ASG from the (n−1)-th level to the n-th level.

In FIG. 3, 1 trigger signal line STV may be directly and electrically connected to the shift registers ASG from the first level to the third level; and the trigger signal line STV may be also directly and electrically connected to the shift registers ASG from the (n−2)-th level to the n-th level.

In FIG. 4, 1 trigger signal line STV may be directly and electrically connected to the shift registers ASG from the first level to the fourth level; and the trigger signal line STV may be also directly and electrically connected to the shift registers ASG from the (n−3)-th level to the n-th level.

In the existing technology, the transistor may be configured between the trigger signal line STV and the shift register ASG. The input terminal of the transistor may be electrically connected to the trigger signal line STV, the output terminal of the transistor may be electrically connected to the shift register ASG. The control terminal of the transistor may control conduction or not through the signal line. When the transistor is turned on for conduction, the trigger signal transmitted in the trigger signal line STV may be transmitted to the shift register ASG. Configuring the transistor may occupy space and increase the cost and complexity of the manufacturing process. In one embodiment, there are no other electronic components between the trigger signal line STV and the shift register ASG, such as no transistors or the like. When the trigger signal line STV transmits the trigger signal, the trigger signal may be directly inputted to the shift register ASG, which may improve the driving efficiency. In addition, no space may be needed to configure electronic components, which may be beneficial for further reducing the frame and achieving narrow frame.

In some optional embodiments, referring to FIGS. 1, 3 and 4, the first-clock signal line CKB, the second-clock signal line CK, and the trigger signal line STV may be arranged along the first direction X and extend along the second direction Y, where the first direction X may intersect the second direction Y; and along the first direction X, the trigger signal line STV may be between the second-clock signal line CK and the shift register ASG, and the trigger signal line STV may be on the side of the second-clock signal line CK away from the first-clock signal line CKB.

In FIG. 1, along the direction pointing from the first non-display region BB1 to the second non-display region BB2, the first first-clock signal line CKB1, the second first-clock signal line CKB2, the first second-clock signal line CK1, the second second-clock signal line CK2, the trigger signal line STV and the shift register may be arranged in sequence; and the trigger signal line STV may be on the side of the second-clock signal line CK away from the first-clock signal line CKB. In such way, the distance between the trigger signal line STV and the shift register ASG may be reduced, thereby improving driving efficiency.

In FIG. 3, along the direction pointing from the first non-display region BB1 to the second non-display region BB2, the first first-clock signal line CKB1, the second first-clock signal line CKB2, the third first-clock signal line CKB3, the first second-clock signal line CK1, the second second-clock signal line CK2, the third second-clock signal line CK3, the trigger signal line STV and the shift register may be arranged in sequence; and the trigger signal line STV may be on the side of the second-clock signal line CK away from the first-clock signal line CKB. In such way, the distance between the trigger signal line STV and the shift register ASG may be reduced, thereby improving the driving efficiency.

In FIG. 4, along the direction pointing from the first non-display region BB1 to the second non-display region BB2, the first-clock signal line CKB1, the second-clock signal line CKB2, the third clock signal line CKB3, the fourth clock signal line CKB4, the first second-clock signal line CK1, the second second-clock signal line CK2, the third second-clock signal line CK3, the fourth clock signal line, the trigger signal line STV and the shift register may be arranged in sequence; and the trigger signal line STV may be on the side of the second-clock signal line CK away from the first-clock signal line CKB. In such way, the distance between the trigger signal line STV and the shift register ASG may be reduced, thereby improving driving efficiency.

Figure 5:
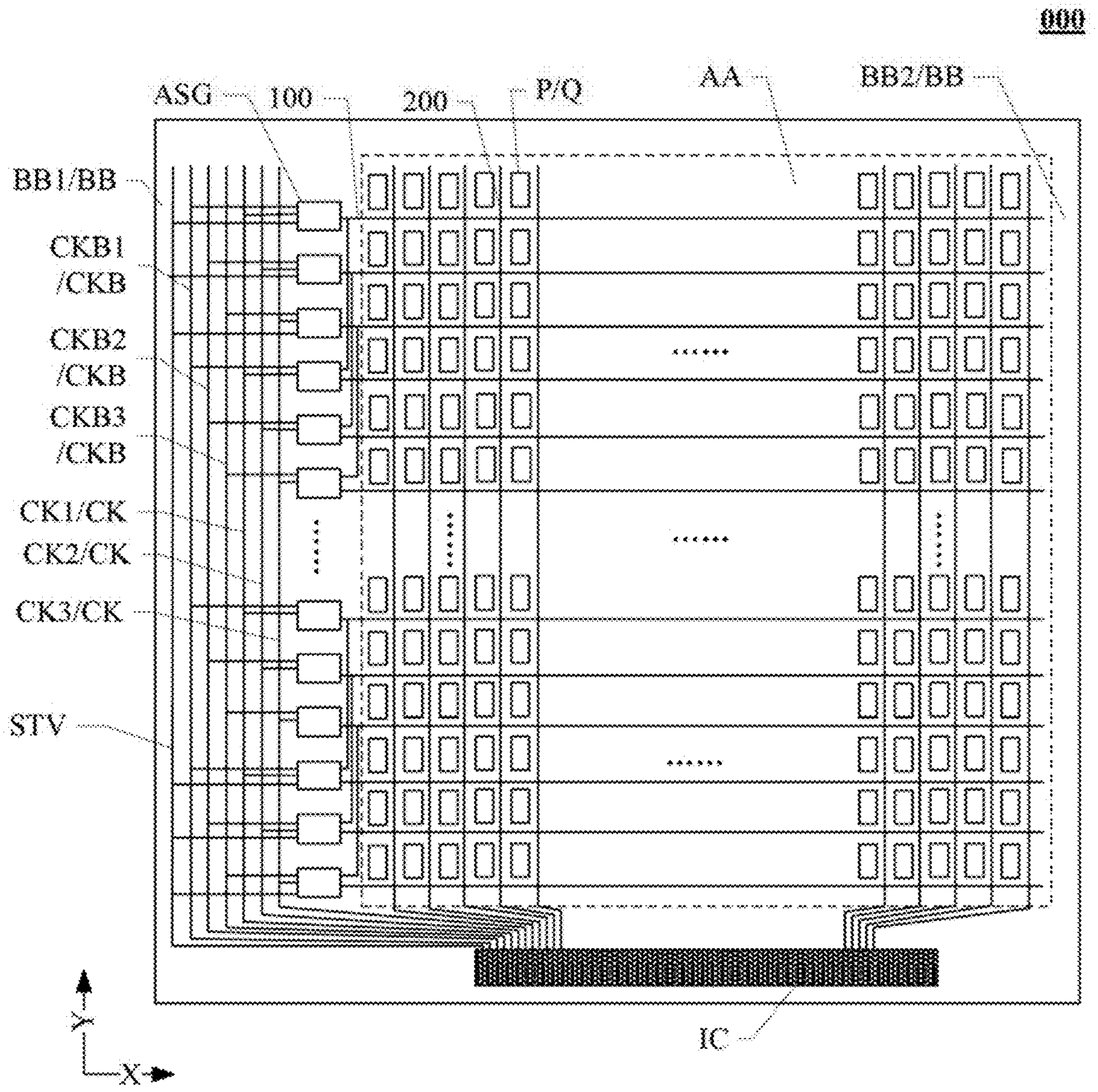
FIG. 5 illustrates another planar structural schematic of a display panel according to various embodiments of the present disclosure.

Referring to FIG. 5, FIG. 5 illustrates another planar structural schematic of a display panel according to various embodiments of the present disclosure. In FIG. 5, the first non-display region BB1 may include 1 trigger signal line STV, 3 first-clock signal lines CKB, 3 second-clock signal lines CK, and n levels of cascaded shift registers ASG. Taking n as a multiple of 3 as an example, the first to third first-clock signal lines CKB may be electrically connected to 3 levels of the shift registers ASG in sequence, and the first to third second-clock signal lines CK3 may be electrically connected to 3 levels of the shift registers ASG in sequence. In FIG. 5, the trigger signal line STV, the first-clock signal line CKB and the second-clock signal line CK may be arranged along the first direction X and extend along the second direction Y; and along the first direction X, the second-clock signal line CK may be between the first-clock signal line CKB and the shift register ASG, and the trigger signal line STV may be on the side of the first-clock signal line CKB away from the second-clock signal line CK. FIG. 5 only takes 3 first-clock signal lines CKB and 3 second-clock signal lines CK as an example for schematic illustration. The quantity of first-clock signal lines CKB and second-clock signal lines CK may be 2, 4 or more than 4, which may not be limited herein. In the present disclosure, the trigger signal line STV may be configured on the side adjacent to the shift register ASG as needed, that is, between the second-clock signal line CK and the shift register ASG or may be configured on the side away from the first-clock signal line CKB, thereby being more flexible for layout arrangement.

Figure 6:
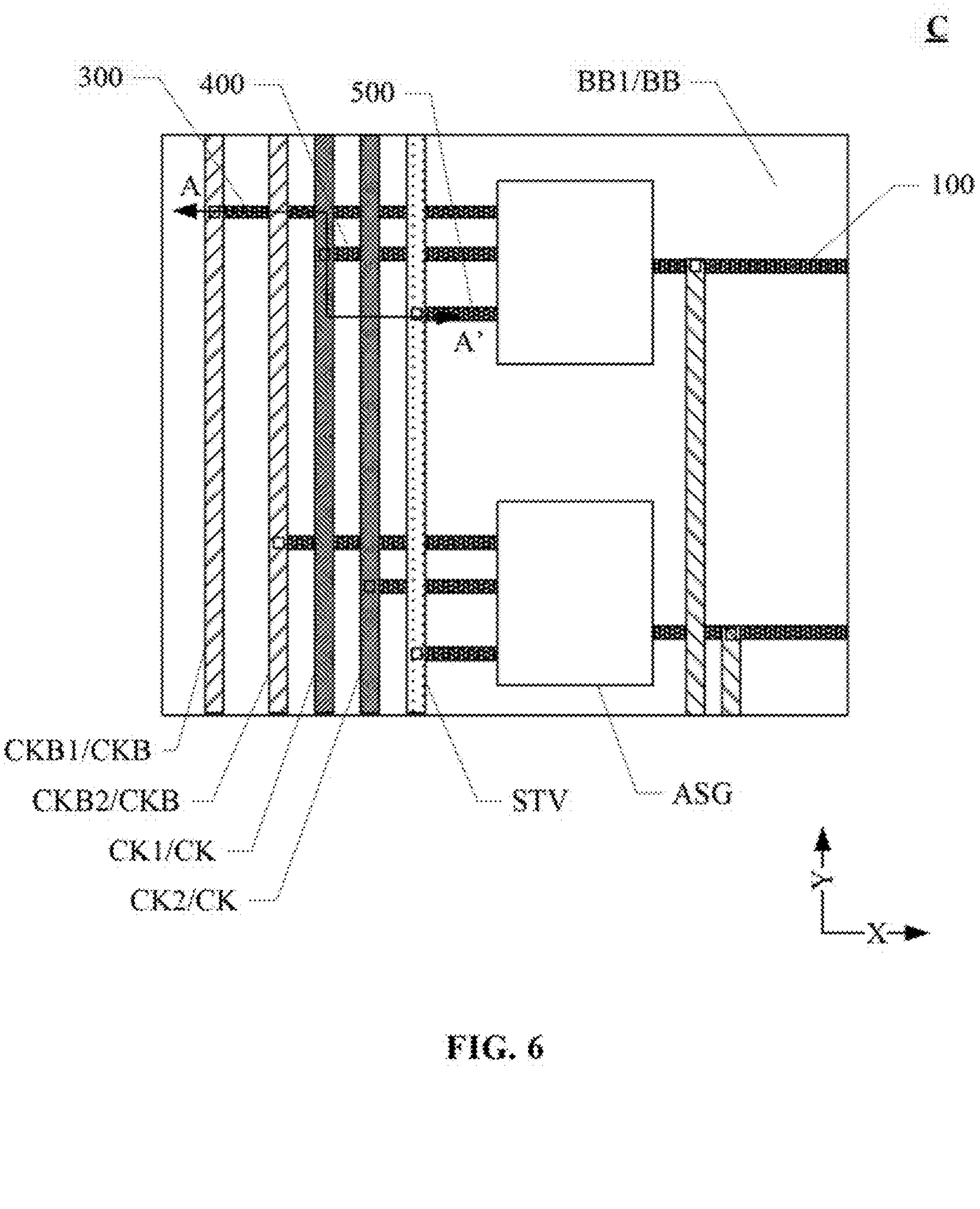
FIG. 6 illustrates a partial enlarged view of a C region in FIG. 1.

In some optional embodiments, referring to FIGS. 1 and 6, FIG. 6 illustrates a partial enlarged view of a C region in FIG. 1; the first-clock signal line CKB may be electrically connected to the shift register ASG through the first connection line 300, the second-clock signal line CK may be electrically connected to the shift register ASG through the second connection line 400, the trigger signal line STV may be directly and electrically connected to the shift register ASG through the third connection line 500; and the first connection line 300, the second connection line 400, and the third connection line 500 may extend along the first direction X.

As shown in FIG. 1, the first-clock signal line CKB, the second-clock signal line CK and the trigger signal line STV may all extend along the second direction Y; and along the direction pointing from the first non-display region BB1 to the second non-display region BB2, the first first-clock signal line CKB1, the second first-clock signal line CKB2, the first second-clock signal line CK1, the second second-clock signal line CK2, the trigger signal line STV and the shift register may be arranged in sequence. As shown in FIG. 6, the first connection line 300, the second connection line 400 and the third connection line 500 may be also configured along the first direction X; the first-clock signal line CKB may be electrically connected to the shift register ASG through the first connection line 300; and one end of the first connection line 300 may be connected to the first-clock signal line CKB, and another end of the first connection line 300 may be connected to the shift register ASG. Optionally, the first connection line 300 and the first-clock signal line CKB may be at different film layers, and the first connection line 300 may be connected to the first-clock signal line CKB through a via; and the second-clock signal line CK may be electrically connected to the shift register ASG through the second connection line 400, one end of the second connection line 400 may be connected to the second-clock signal line CK, and another end of the second connection line 400 may be connected to the shift register ASG. Optionally, the second connection line 400 and the second-clock signal line CK may be at different film layers, and the second connection line 400 may be connected to the second-clock signal line CK through a via; and the trigger signal line STV may be directly electrically connected to the shift register ASG through the third connection line 500, one end of the third connection line 500 may be connected to the trigger signal line STV, and another end of the third connection line 500 may be connected to the shift register ASG. Optionally, the third connection line 500 and the trigger signal line STV may be at different film layers, and the third connection line 500 may be connected to the trigger signal line STV through a via. In one embodiment, through the first connection line

300 extending along the first direction X, the first-clock signal line CKB may be electrically connected to the shift register ASG to transmit the first-clock signal; and through the second connection line 400 extending along the first direction X, the second-clock signal line CK may be electrically connected to the shift register ASG to transmit the second-clock signal. Therefore, the pre-charging time of the shift register ASG may be increased. Through the third connection line 500 extending along the first direction X, the trigger signal line STV may be electrically connected to the shift register ASG to realize the transmission of the trigger signal.

It should be understood that the display panel may include multiple metal layers, and the trigger signal line STV in the present disclosure may be in any metal layer, which may not be limited herein. For example, the trigger signal line STV may be in any layer of the first metal layer, the second metal layer, the third metal layer or the fourth metal layer. Obviously, if the trigger signal line STV is between the second-clock signal CK and the shift register ASG, the trigger signal line STV may be overlapped with the first connection line 300 and the second connection line 400. At the overlapping position, the trigger signal line STV may be at a layer different from the first connection line 300 and the second connection line 400. At other non-overlapping positions, the trigger signal line STV may be at a layer same as the first connection line 300 and the second connection line 400. Obviously, at this point, the first connection line 300 and the second connection line 400 may need to perform line change. Exemplary, at the overlapping position, the trigger signal line STV may need to be changed to a metal layer different from the first connection line 300 and the second connection line 400.

Figure 7:
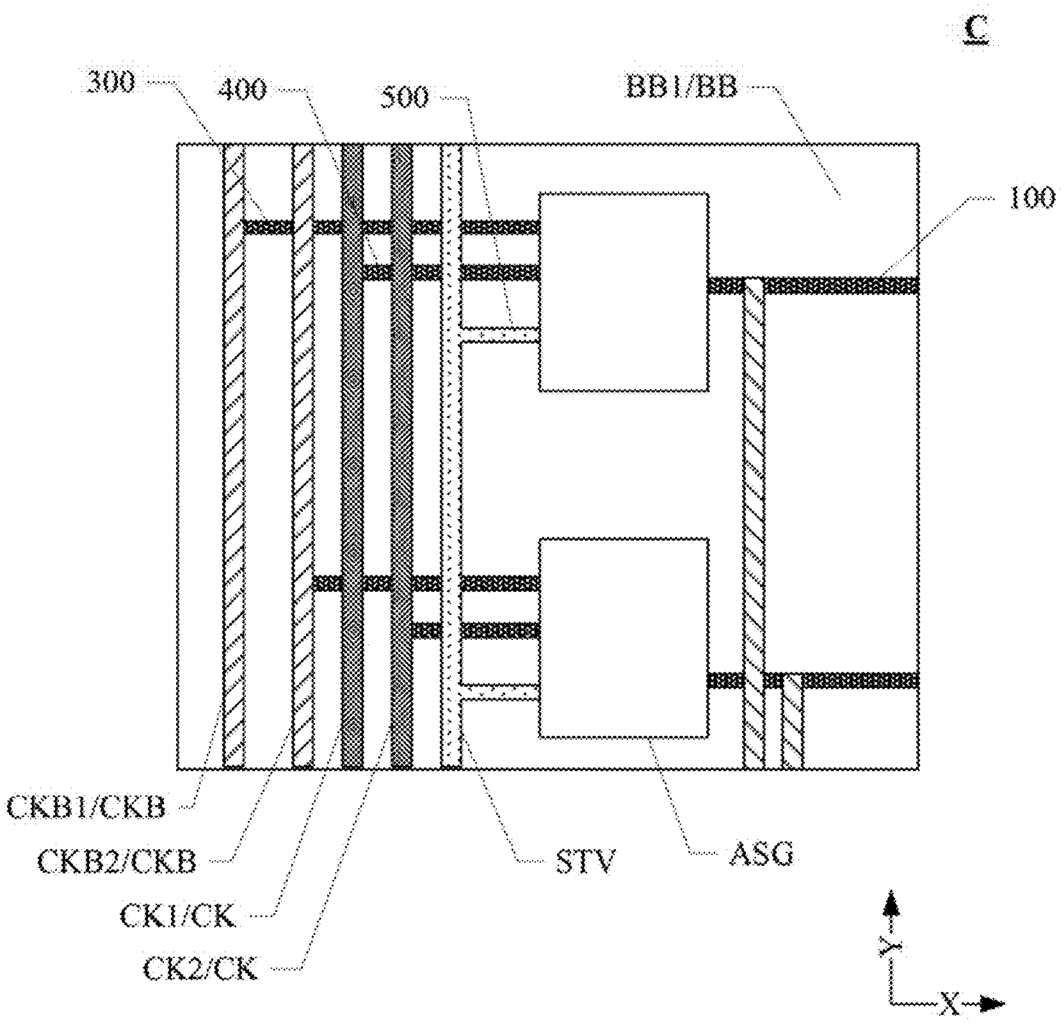
FIG. 7 illustrates another partial enlarged view of a C region in FIG. 1.

In some optional embodiments, referring to FIGS. 1 and 7, FIG. 7 illustrates another partial enlarged view of a C region in FIG. 1; and the trigger signal line STV and the third connection line 500 may be at a same film layer.

In FIG. 1, the first-clock signal line CKB, the second-clock signal line CK and the trigger signal line STV may all extend along the second direction Y; and along the direction pointing from the first non-display region BB1 to the second non-display region BB2, the first first-clock signal line CKB1, the second first-clock signal line CKB2, the first second-clock signal line CK1, the second second-clock signal line CK2, the trigger signal line STV and the shift register may be arranged in sequence. As shown in FIG. 7, the first connection line 300, the second connection line 400 and the third connection line 500 may be also configured along the first direction X. One end of the first connection line 300 may be connected to the first-clock signal line CKB, and another end of the first connection line 300 may be connected to the shift register ASG. Optionally, the first connection line 300 and the first-clock signal line CKB may be at different film layers, and the first connection line 300 may be connected to the first-clock signal line CKB through a via; and one end of the second connection line 400 may be connected to the second-clock signal line CK, and another end of the second connection line 400 may be connected to the shift register ASG. Optionally, the second connection line 400 and the second-clock signal line CK may be at different film layers, and the second connection line 400 may be connected to the second-clock signal line CK through a via; the trigger signal line STV may be directly and electrically connected to the shift register ASG through the third connection line 500, one end of the third connection line 500 may be connected to the trigger signal line STV, and another end of the third connection line 500 may be connected to the shift register ASG. In one embodiment, the third connection line 500 and the trigger signal line STV may be at a same film layer. The trigger signal line STV may be on the side of the second-clock signal line CK away from the first-clock signal line CKB. The trigger signal line STV may be the closest to the shift register ASG. Therefore, there may be no other signal line extending along the second direction Y and located in a same film layer as the trigger signal line STV between the trigger signal line STV and the shift register ASG. The third connection line 500 extending along the first direction X may also be in a same layer as the trigger signal line STV, which may not cause the problem of signal short circuit. Moreover, there may be no need to fabricate the third connection line 500 and the trigger signal line STV in different film layers; and the trigger signal difference and the third connection line 500 may be fabricated in a same process to simplify the process.

Figure 8:
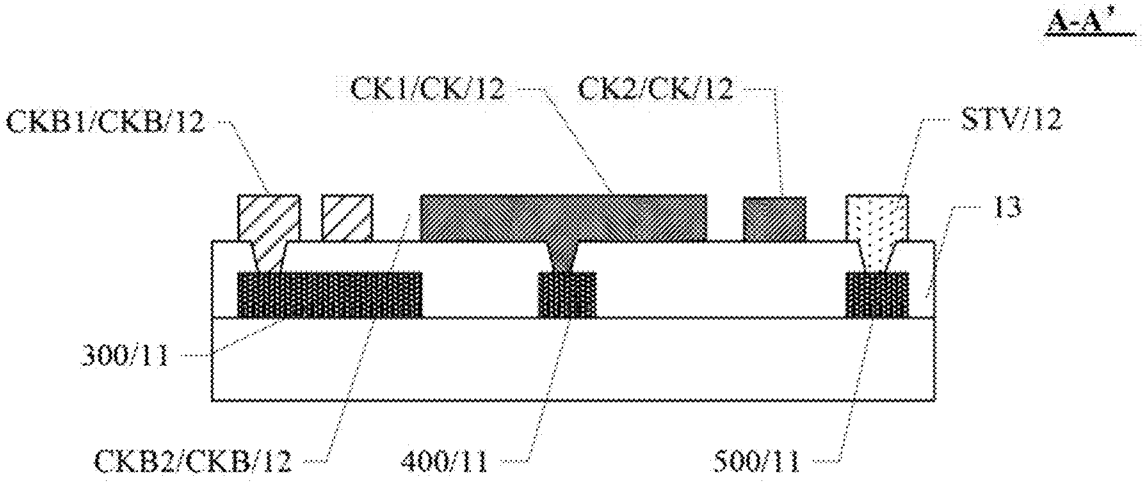
FIG. 8 illustrates a cross-sectional view along an A-A' direction in FIG. 6.

In some optional embodiments, referring to FIGS. 6 and 8, FIG. 8 illustrates a cross-sectional view along an A-A' direction in FIG. 6; and the trigger signal line STV and the first connection line 300 and the second connection line 400 may be at different film layers.

For example, the display panel includes a substrate 10, a first metal layer 11 on one side of the substrate 10, an insulating layer 13 on the side of the first metal layer 11 away from the substrate 10, and a second metal layer 12 on the side of the insulating layer 13 away from the substrate 10. The first-clock signal line CKB, the second-clock signal line CK and the trigger signal line STV may be all in the second metal layer 12; the first connection line 300 and the second connection line 400 may be at the first metal layer 11; the first connection line 300 and the first-clock signal line CKB may be connected to each other through a via; and the second connection line 400 and the second-clock signal line CK may be connected to each other through a via. The first-clock signal line CKB and the second-clock signal line CK are both on the side of the trigger signal line STV away from the shift register ASG along the first direction X. Therefore, the first connection line 300 may need to pass through the trigger signal line STV when connecting the first-clock signal line CKB and the shift register ASG, and the second connection line 400 may need to pass through the trigger signal line STV when connecting the second-clock signal line CK and the shift register ASG. The first connection line 300 and the second connection line 400 may be at the first metal layer 11, and the trigger signal line STV may be configured in the second metal layer 12. The trigger signal line STV and the first connection line 300 and the second connection line 400 may be at different film layers, which may prevent the first connection line 300 and the trigger signal line STV from short-circuiting and also prevent the second connection line 400 and the trigger signal line STV from short-circuiting.

Figure 9:
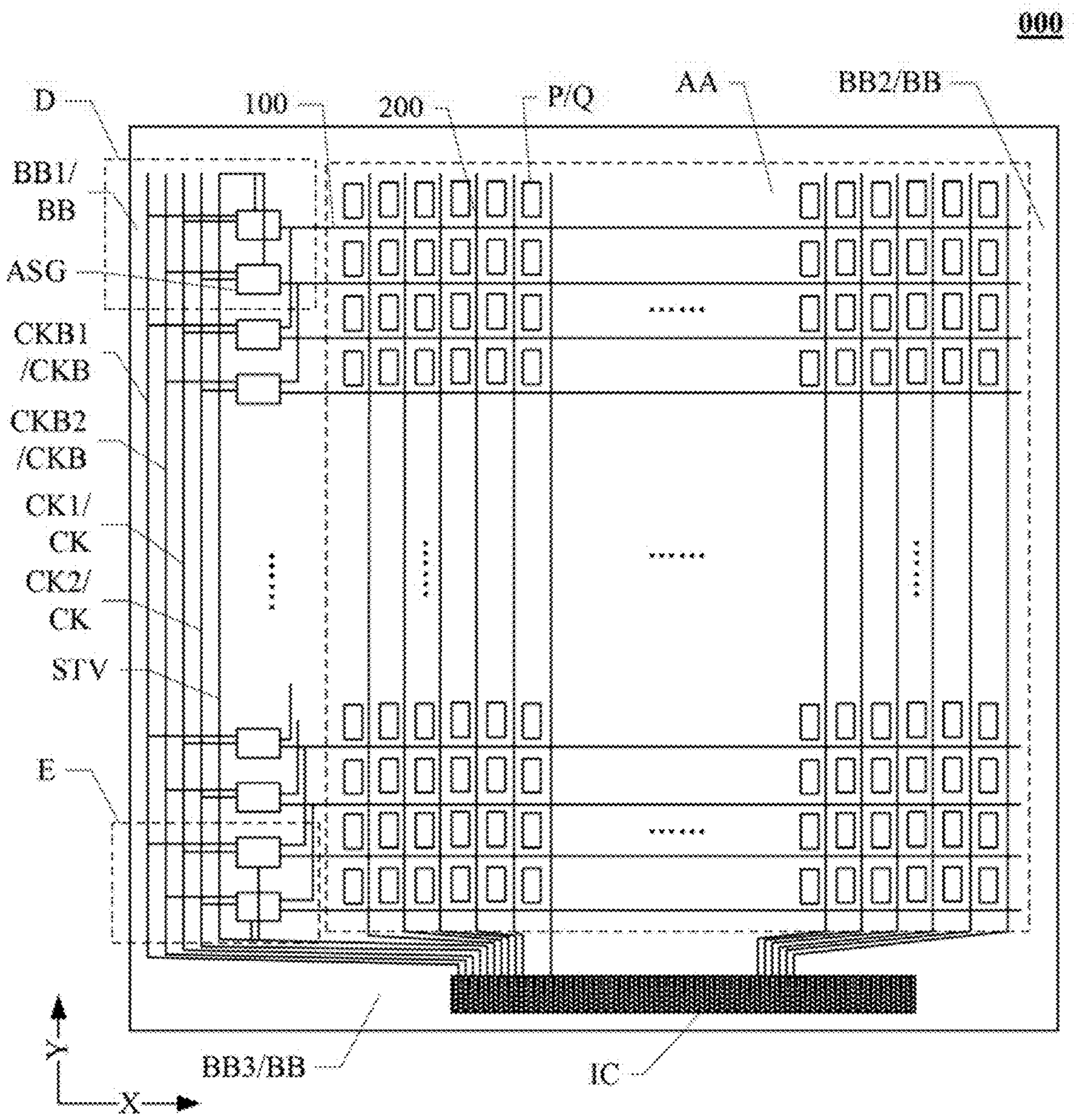
FIG. 9 illustrates another planar structural schematic of a display panel according to various embodiments of the present disclosure.
Figure 10:
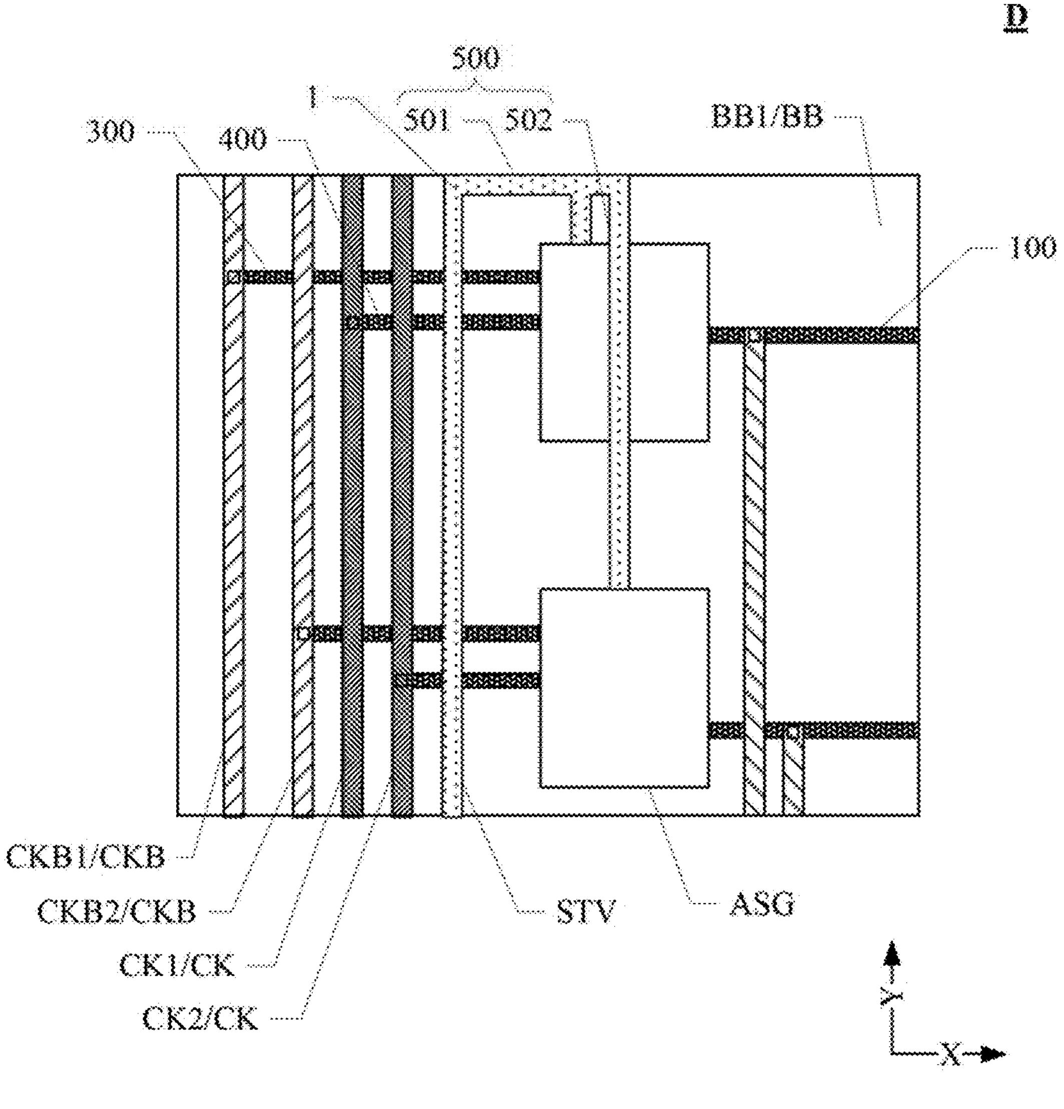
FIG. 10 illustrates a partial enlarged view of a D region in FIG. 9.
Figure 11:
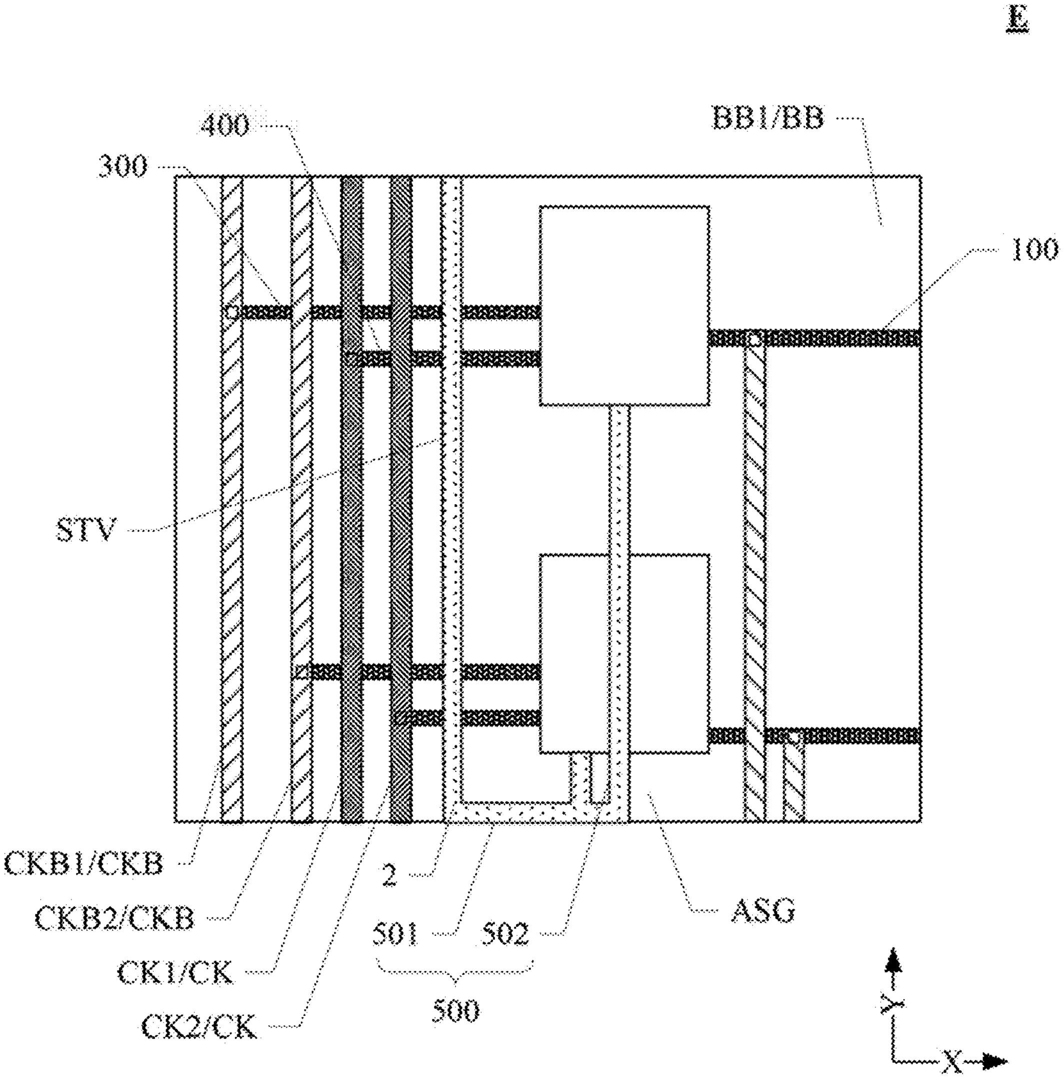
FIG. 11 illustrates a partial enlarged view of an E region in FIG. 9.

In some optional embodiments, referring to FIGS. 9-11, FIG. 9 illustrates another planar structural schematic of a display panel according to various embodiments of the present disclosure; FIG. 10 illustrates a partial enlarged view of a D region in FIG. 9; and FIG. 11 illustrates a partial enlarged view of an E region in FIG. 9. The third connection line 500 may be connected to the first end 1 and the second end 2 of the trigger signal line STV, respectively; each third connection line 500 may include 1 first portion and k second portions; the first portion may extend along the first direction X, and one end of the first portion may be electrically connected to the trigger signal line STV; and the second portion may extend along the second direction Y, and one end of the second portion may be connected to the first portion, and another end of the second portion may be connected to the shift register ASG.

For the third connection line 500 connected to the first end 1 of the trigger signal line STV, the k second portions may be respectively connected to the shift registers ASG from the first level to the k-th-level. For the third connection line 500 connected to the second end 2 of the trigger signal line STV, the k second portions may be respectively connected to the shift registers ASG from the (n−k+1)-th level to the n-th level.

For example, the trigger signal line STV may include two ends, namely, the first end 1 of the trigger signal line STV and the second end 2 of the trigger signal line STV. FIG. 9 only takes two first-clock signal lines CKB and two second-clock signal lines CK as an example for schematic illustration. In FIG. 10, the third connection line 500 may be connected to the first end 1 of the trigger signal line STV (i.e., the side of the trigger signal line STV adjacent to the upper frame); the third connection line 500 may include the first portion extending along the first direction X and two second portions extending along the second direction Y; and one end of either of two second portions may be connected to the first portion, where another end of one second portion may be connected to the first level shift register ASG, and another end of another second portion may be connected to the second level shift register ASG. In FIG. 11, the third connection line 500 may be connected to the second end 2 of the trigger signal line STV (i.e., the side of the trigger signal line STV adjacent to the lower frame); the third connection line 500 may include one first portion extending along the first direction X and two second portions extending along the second direction Y; and one end of either of two second portions may be connected to the first portion, where another end of one second portion may be connected to the n-th-level shift register ASG, and another end of another second portion may be connected to the (n−1)-th-level shift register ASG.

In one embodiment, the third connection line 500 may be configured at the position of the upper frame and the lower frame, and there may be no need to configure the third connection line 500 in the first non-display region BB1, which may further reduce the width of the first non-display region BB1 along the first direction X and achieve narrow frame.

Figure 12:
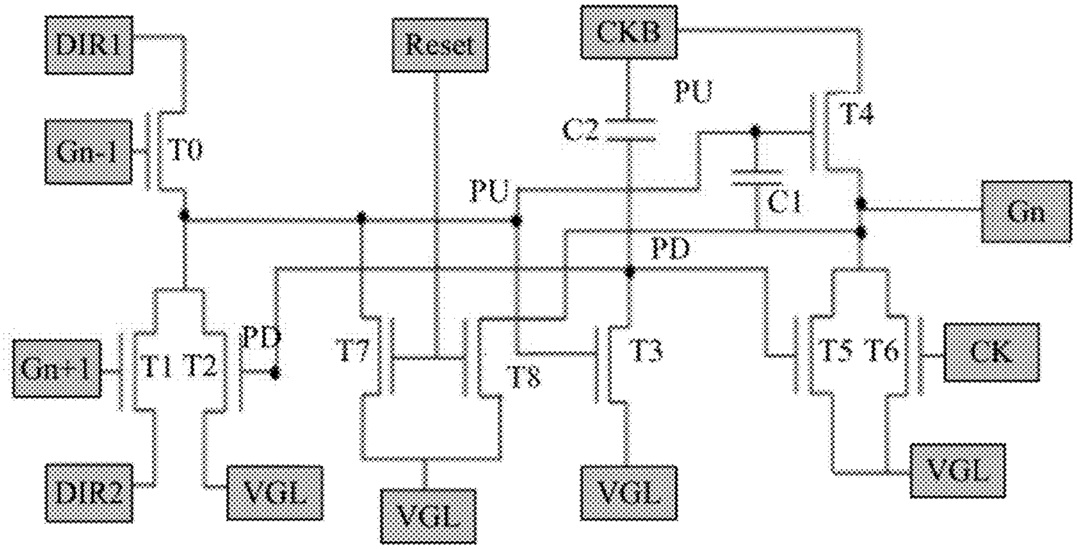
FIG. 12 illustrates a structural schematic of a shift register according to various embodiments of the present disclosure.

In some optional embodiments, referring to FIGS. 1 and 12, FIG. 12 illustrates a structural schematic of a shift register according to various embodiments of the present disclosure. The shift register ASG may include the first transistor T0, where the control terminal of the first transistor T0 may be electrically connected to the output terminal Gn−1 of the previous level shift register, the first terminal of the first transistor T0 may be electrically connected to the forward scan signal terminal DIR1, and the second terminal of the first transistor T0 may be electrically connected to the first node PU; the second transistor T1, where the control terminal of the second transistor T1 may be electrically connected to the output terminal Gn+1 of the next level shift register, the first terminal of the second transistor T1 may be electrically connected to the reverse scan signal terminal DIR2, and the second terminal of the second transistor T1 may be electrically connected to the first node PU; the third transistor T2, where the control terminal of the third transistor T2 may be electrically connected to the second node PD, the first terminal of the third transistor T2 may be electrically connected to the low potential signal terminal VGL, and the second terminal of the third transistor T2 may be electrically connected to the first node PU; the fourth transistor T3, where the control terminal of the fourth transistor T3 may be electrically connected to the first node PU, the first terminal of the fourth transistor T3 may be electrically connected to the second node PD, and the second terminal of the fourth transistor T3 may be electrically connected to the low potential signal terminal VGL; the fifth transistor T4, where the control terminal of the fifth transistor T4 may be electrically connected to the first node PU and the first capacitor C1, the first terminal of the fifth transistor T4 may be electrically connected to the first-clock signal line CKB, and the second terminal of the fifth transistor T4 may be electrically connected to the output terminal Gn of the shift register; the second capacitor C2, electrically connected to the first-clock signal line CKB and the second node PD respectively; the sixth transistor T5, where the control terminal of the sixth transistor T5 may be electrically connected to the second node PD, the first terminal of the sixth transistor T5 may be electrically connected to the output terminal Gn of the shift register and the first capacitor C1, and the second terminal of the sixth transistor T5 may be electrically connected to the low potential signal terminal VGL; the seventh transistor T6, where the control terminal of the seventh transistor T6 may be electrically connected to the second-clock signal line CK, the first terminal of the seventh transistor T6 may be electrically connected to the output terminal Gn of the shift register, and the second terminal of the seventh transistor T6 may be electrically connected to the low potential signal terminal VGL; the eighth transistor T7, where the control terminal of the eighth transistor T7 may be electrically connected to the reset signal terminal Reset, the first terminal of the eighth transistor T7 may be electrically connected to the first node PU, and the second terminal of the eighth transistor T7 may be electrically connected to the low potential signal terminal VGL; and the ninth transistor T8, where the control terminal of the ninth transistor T8 may be electrically connected to the reset signal terminal Reset, the first terminal of the ninth transistor T8 may be electrically connected to the output terminal Gn of the shift register, and the second terminal of the ninth transistor T8 may be electrically connected to the low potential signal terminal VGL.

Optionally, the capacitance value of the first capacitor C1 may be greater than the capacitance value of the second capacitor C2, the capacitance value of the first capacitor C1 may be between 0.5 pf-7 pf, and the capacitance value of the second capacitor C2 may be between 0.5 pf-7 pf. Optionally, the capacitance value of the first capacitor C1 may increase as the size of the display panel increases, and/or the capacitance value of the first capacitor C1 may increase as the resolution of the display panel increases. Similarly, optionally, the capacitance value of the second capacitor C2 may increase as the size of the display panel increases, and/or the capacitance value of the second capacitor may increase as the resolution of the display panel increases. Compared with the existing technology, the value of the first capacitor C1 of the present disclosure may increase accordingly to maintain the potential of the first node PU, and the value of the second capacitor C2 may increase accordingly to maintain the potential of the second node PD. Optionally, if the capacitance value of the first capacitor C1 in the shift register ASG in the existing technology is A, the value of the first capacitor C1 in one embodiment may be between 1.1A-1.3A; and if the capacitance value of the second capacitor C2 in the shift register ASG in the existing technology is B, the value of the first capacitor C1 in one embodiment may be between 1.1B-1.3B.

For the trigger signal line STV, the trigger signal line STV may be electrically connected to the output terminal Gn−1 of previous level shift register of the first level shift register ASG, and may be electrically connected to the output terminal Gn−1 of previous level shift register of the second level shift register ASG.

The working principle of the shift register ASG is described in detail below. The display panel of the present disclosure may not need to adjust the structure of the shift registers ASG, which may implement sending the trigger signal through a same trigger signal line STV and realize narrow frame.

In some optional embodiments, referring to FIGS. 1 and 12, the control terminals of the first transistors T0 of the shift registers ASG from the first level to the k-th level and from the (n−k+1)-th level to the n-th level may be electrically connected to the trigger signal line STV.

In FIG. 1, the trigger signal line STV may be electrically connected to the first and second level shift registers ASG, where the trigger signal line STV may be electrically connected to the control terminal of the first transistor T0 of the first level shift register ASG, and may be electrically connected to the control terminal of the first transistor T0 of the second level shift register ASG. When the trigger signal transmitted by the trigger signal line STV is an enable signal, the first transistor T0 may be turned on for conduction, and the forward scan signal inputted by the forward scan signal terminal DIR1 may be inputted to the first node PU to pre-charge the first node PU. Similarly, the trigger signal line STV may be electrically connected to the (n−1)-th and n-th level shift registers ASG, where the trigger signal line STV may be electrically connected to the control terminal of the first transistor T0 of the (n−1)-th-level shift register ASG, and may be electrically connected to the control terminal of the first transistor T0 of the n-th-level shift register ASG. When the trigger signal transmitted by the trigger signal line STV is an enable signal, the first transistor T0 may be turned on for conduction, and the positive scan signal inputted by the forward scan signal terminal DIR1 may be inputted to the first node PU to pre-charge the first node PU.

Figure 13:
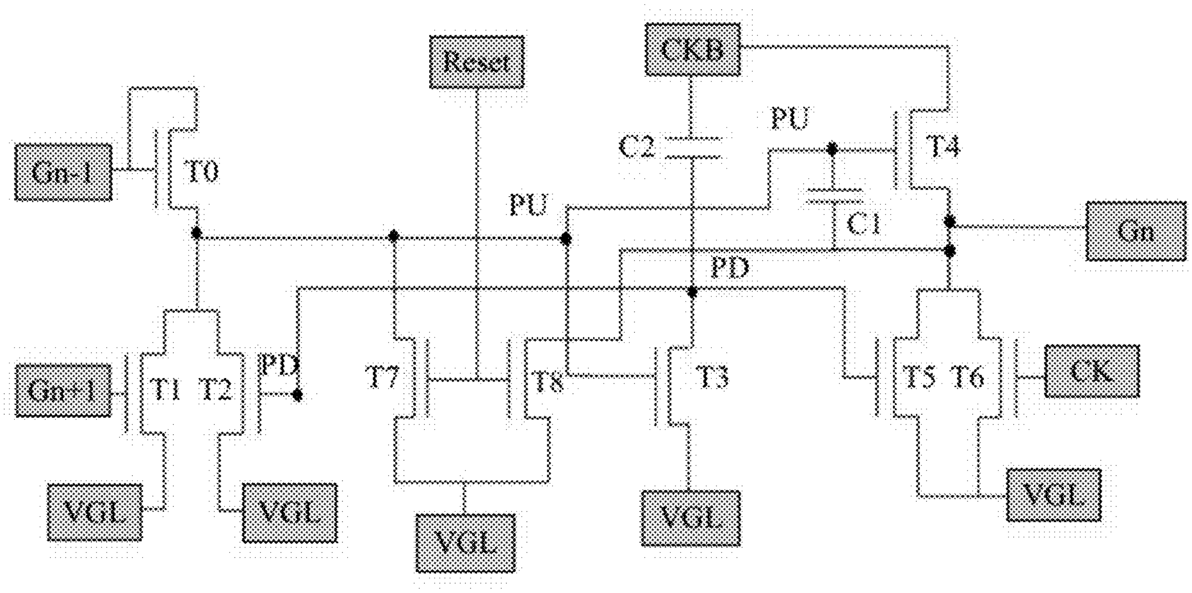
FIG. 13 illustrates another planar structural schematic of a shift register according to various embodiments of the present disclosure.

In some optional embodiments, referring to FIGS. 1 and 13, FIG. 13 illustrates another planar structural schematic of a shift register according to various embodiments of the present disclosure. The shift register ASG may include the first diode T0, where the input terminal of the first diode T0 may be electrically connected to the output terminal Gn−1 of the previous level shift register, and the output terminal of the first diode T0 may be electrically connected to the first node PU; the second transistor T1, where the control terminal of the second transistor T1 may be electrically connected to the output terminal Gn+1 of the next level shift register, the first terminal of the second transistor T1 may be electrically connected to the low potential signal terminal VGL, and the second terminal of the second transistor T1 may be electrically connected to the first node PU; the third transistor T2, where the control terminal of the third transistor T2 may be electrically connected to the second node PD, the first terminal of the third transistor T2 may be electrically connected to the low potential signal terminal VGL, and the second terminal of the third transistor T2 may be electrically connected to the first node PU; the fourth transistor T3, where the control terminal of the fourth transistor T3 may be electrically connected to the first node PU, the first terminal of the fourth transistor T3 may be electrically connected to the second node PD, and the second terminal of the fourth transistor T3 may be electrically connected to the low potential signal terminal VGL; the fifth transistor T4, where the control terminal of the fifth transistor T4 may be electrically connected to the first node PU and the first capacitor C1, the first terminal of the fifth transistor T4 may be electrically connected to the first-clock signal line CKB, and the second terminal of the fifth transistor T4 may be electrically connected to the output terminal Gn of the shift register; the second capacitor C2, electrically connected to the first-clock signal line CKB and the second node PD respectively; the sixth transistor T5, where the control terminal of the sixth transistor T5 may be electrically connected to the second node PD, the first terminal of the sixth transistor T5 may be electrically connected to the output terminal Gn of the shift register and the first capacitor C1, and the second terminal of the sixth transistor T5 may be electrically connected to the low potential signal terminal VGL; the seventh transistor T6, where the control terminal of the seventh transistor T6 may be electrically connected to the second-clock signal line CK, the first terminal of the seventh transistor T6 may be electrically connected to the output terminal Gn of the shift register, and the second terminal of the seventh transistor T6 may be electrically connected to the low potential signal terminal VGL; the eighth transistor T7, where the control terminal of the eighth transistor T7 may be electrically connected to the reset signal terminal Reset, the first terminal of the eighth transistor T7 may be electrically connected to the first node PU, and the second terminal of the eighth transistor T7 may be electrically connected to the low potential signal terminal VGL; and the ninth transistor T8, where the control terminal of the ninth transistor T8 may be electrically connected to the reset signal terminal Reset, the first terminal of the ninth transistor T8 may be electrically connected to the output terminal Gn of the shift register, and the second terminal of the ninth transistor T8 may be electrically connected to the low potential signal terminal VGL.

For the trigger signal line STV, the trigger signal line STV may be electrically connected to the output terminal Gn−1 of the previous level shift register of the first level shift register ASG, and may be electrically connected to the output terminal Gn−1 of the previous level shift register of the second level shift register ASG.

Such structure may perform unidirectional step-by-step scanning from the first level to the n-th level during scanning.

The display panel of the present disclosure may not need to adjust the structure of the shift registers ASG, which may implement sending the trigger signal through a same trigger signal line STV and realize narrow frame.

In some optional embodiments, T1 may be a diode. At this case, the input terminal of the diode T1 may be electrically connected to the reverse scan signal terminal DIR2, and the first terminal of the first transistor T0 may be connected to the low potential signal terminal VGL. Such structure may perform reverse scanning from the n-th level to the first level step by step during scanning.

Figure 14:
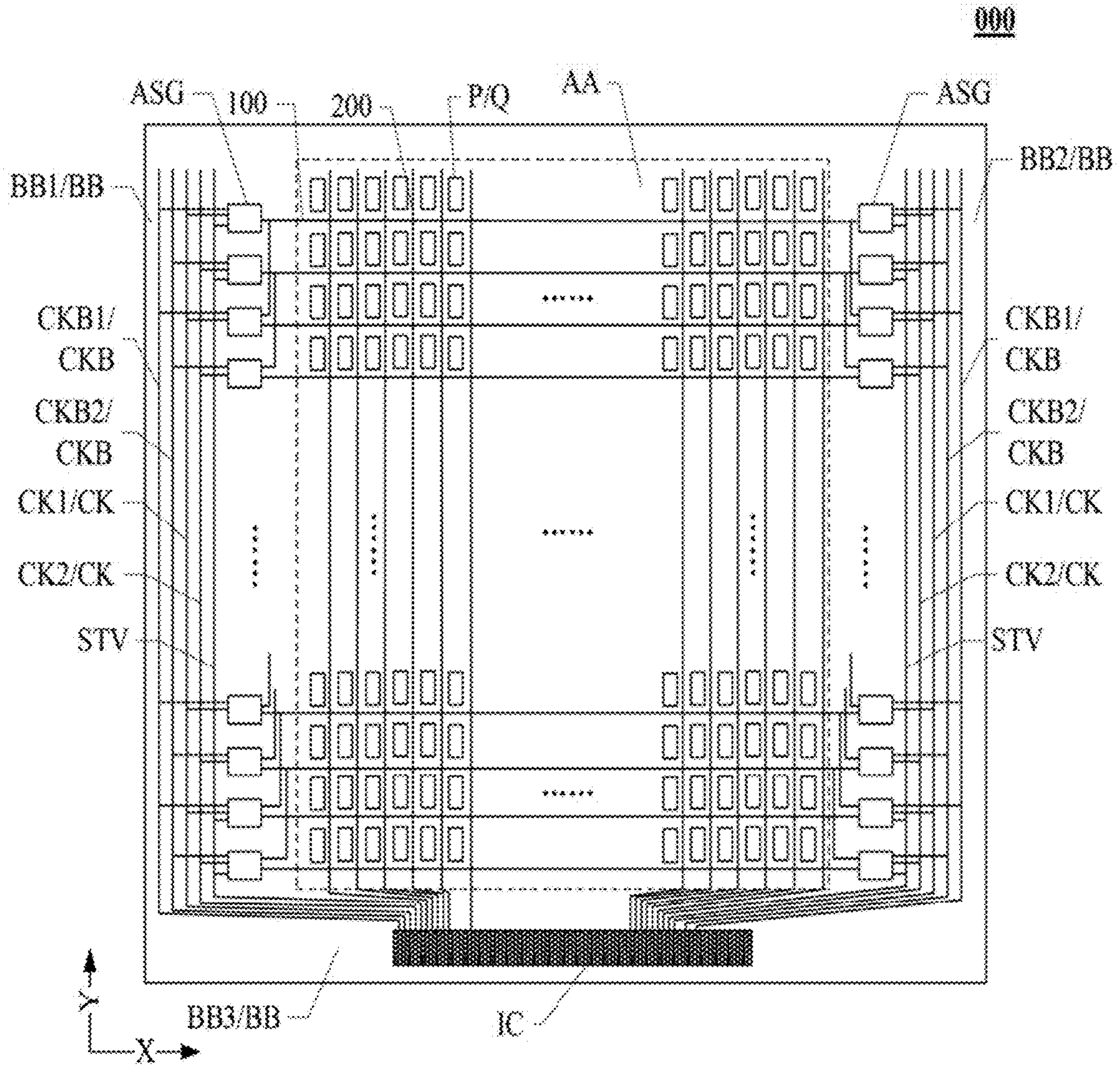
FIG. 14 illustrates another planar structural schematic of a display panel according to various embodiments of the present disclosure.

In some optional embodiments, referring to FIG. 14, FIG. 14 illustrates another planar structural schematic of a display panel according to various embodiments of the present disclosure. The non-display region BB may also include the second non-display region BB2 arranged along the first direction and opposite to the first non-display region BB1. The first direction of the second non-display region BB2 may be the extending direction of the scan line 100.

The second non-display region BB2 may include a trigger signal line STV, the first-clock signal lines CKB from the first first-clock signal line to the k-th first-clock signal line, the second-clock signal lines CK from the first second-clock signal line to the k-th second-clock signal line, and n levels of cascaded shift registers ASG. The output terminals Gn of the shift registers may be electrically connected to the scan lines 100 in one-to-one correspondence; and the output terminal Gn of the m-th-level shift register may be electrically connected to the first terminal of the (m+k)-th-level shift register ASG. The first-clock signal lines CKB from the first first-clock signal line to the k-th first-clock signal line may be connected to the k levels of shift registers ASG in sequence; the second-clock signal lines CK from the first second-clock signal line to the k-th second-clock signal line may be connected to the k levels of shift registers ASG in sequence; and the trigger signal line STV may be connected to the shift registers ASG from the first level to the k-th level, and the shift registers ASG from the (n−k+1)-th level to the n-th level.

The output terminal Gn of the i-th-level shift register may be electrically connected to the i-th scan line 100, and the output terminal Gn of the i-th-level shift register in the first non-display region BB1 may be also electrically connected to the i-th scan line 100, where i may be a positive integer greater than or equal to k and less than or equal to n.

For example, in one embodiment, a bilateral drive may be configured; the second non-display region BB2 may be symmetrically arranged with the first non-display region BB1; and the output terminal Gn of the i-th-level shift register may be electrically connected to the i-th scan line 100, and the output terminal Gn of the i-th-level shift register in the first non-display region BB1 may be also electrically connected to the i-th scan line 100. FIG. 14 only uses k=2 as an example for schematic illustration. k may also be equal to 3 or 4, or k may be a positive integer greater than 4, which may not be limited herein.

In FIG. 14, in the second non-display region BB2, the first level shift register ASG may be electrically connected to the first first-clock signal line CKB1 and the first second-clock signal line CK1; the first first-clock signal line CKB1 and the first second-clock signal line CK1 may send the first-clock signal and the second-clock signal to the first level shift register ASG; and the output terminal Gn of the first level shift register may be electrically connected to the first terminal of the third level shift register ASG, and the output terminal Gn of the first level shift register may be also electrically connected to the first scan line 100.

The second level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the second level shift register ASG; and the output terminal Gn of the second level shift register may be electrically connected to the first terminal of the fourth level shift register ASG, and the output terminal Gn of the second level shift register may be also electrically connected to the second scan line 100.

The third level shift register ASG may be electrically connected to the first first-clock signal line CKB1 and the first second-clock signal line CK1; the first first-clock signal line CKB1 and the first second-clock signal line CK1 may send the first-clock signal and the second-clock signal to the third level shift register ASG; and the output terminal Gn of the third level shift register may be electrically connected to the first terminal of the fifth level shift register ASG, and the output terminal Gn of the third level shift register may be also electrically connected to the third scan line 100.

The fourth level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the fourth level shift register ASG; and the output terminal Gn of the fourth level shift register may be electrically connected to the first terminal of the sixth level shift register ASG, and the output terminal Gn of the fourth level shift register may be also electrically connected to the fourth scan line 100.

The same/similar arrangement may be applied to all shift registers, e.g., the fifth, the sixth, the seventh, till the n-th-level shift register ASG.

For example, the (n−3)-th-level shift register ASG may be electrically connected to the first first-clock signal line CKB1 and the first second-clock signal line CK1; the first-clock signal line CKB1 and the first second-clock signal line CK1 may send the first-clock signal and the second-clock signal to the (n−3)-th-level shift register ASG; and the output terminal Gn of the (n−3)-th-level shift register may be electrically connected to the first terminal of the (n−1)-th-level shift register ASG, and the output terminal Gn of the (n−3)-th-level shift register may be also electrically connected to the (n−3)-th scan line 100.

The (n−2)-th-level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the (n−2)-th-level shift register ASG; and the output terminal Gn of the (n−2)-th-level shift register may be electrically connected to the first terminal of the (n−2)-th-level shift register ASG, and the output terminal Gn of the (n−2)-th-level shift register may be electrically connected to the (n−2)-th scan line 100.

The (n−1)-th-level shift register ASG may be electrically connected to the first first-clock signal line CKB1 and the first second-clock signal line CK1; the first first-clock signal line CKB1 and the first second-clock signal line CK1 may send the first-clock signal and the second-clock signal to the (n−1)-th-level shift register ASG; and the output terminal Gn of the (n−1)-th-level shift register may be electrically connected to the (n−1)-th scan line 100.

The n-th-level shift register ASG may be electrically connected to the second first-clock signal line CKB2 and the second second-clock signal line CK2; the second first-clock signal line CKB2 and the second second-clock signal line CK2 may send the first-clock signal and the second-clock signal to the n-th-level shift register ASG; and the output terminal Gn of the n-th-level shift register may be electrically connected to the n-th scan line 100.

Since only one trigger signal line STV is configured in the first non-display region BB1 and the second non-display region BB2 in the present disclosure, space may be further saved. Meanwhile, the first non-display region BB1 and the second non-display region BB2 may be reduced to realize narrow frame. The present disclosure may realize narrow frame under the premise of ensuring pre-charging and charging time.

Figure 15:
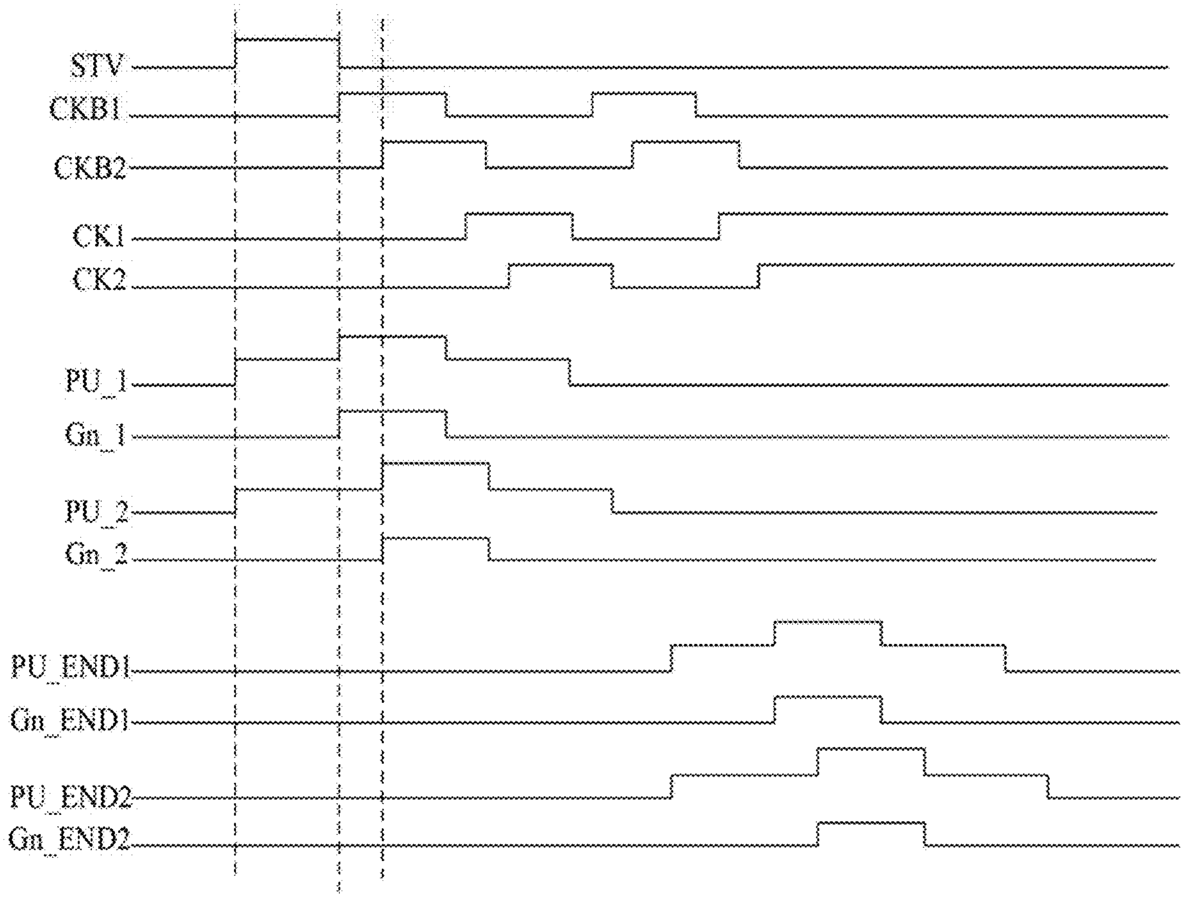
FIG. 15 illustrates a driving time sequence diagram of a display panel according to various embodiments of the present disclosure.
Figure 16:
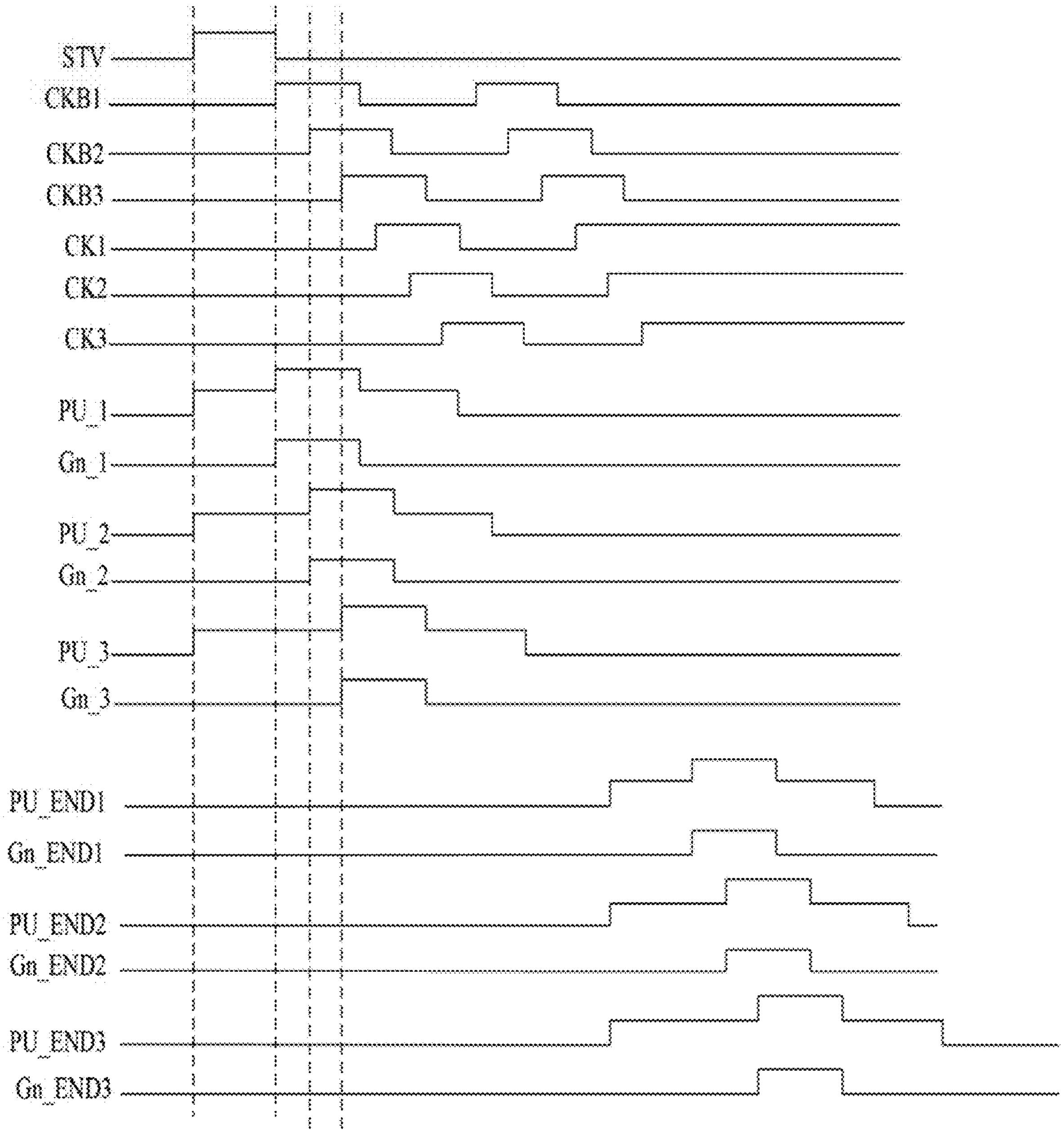
FIG. 16 illustrates another driving time sequence diagram of a display panel according to various embodiments of the present disclosure.
Figure 17:
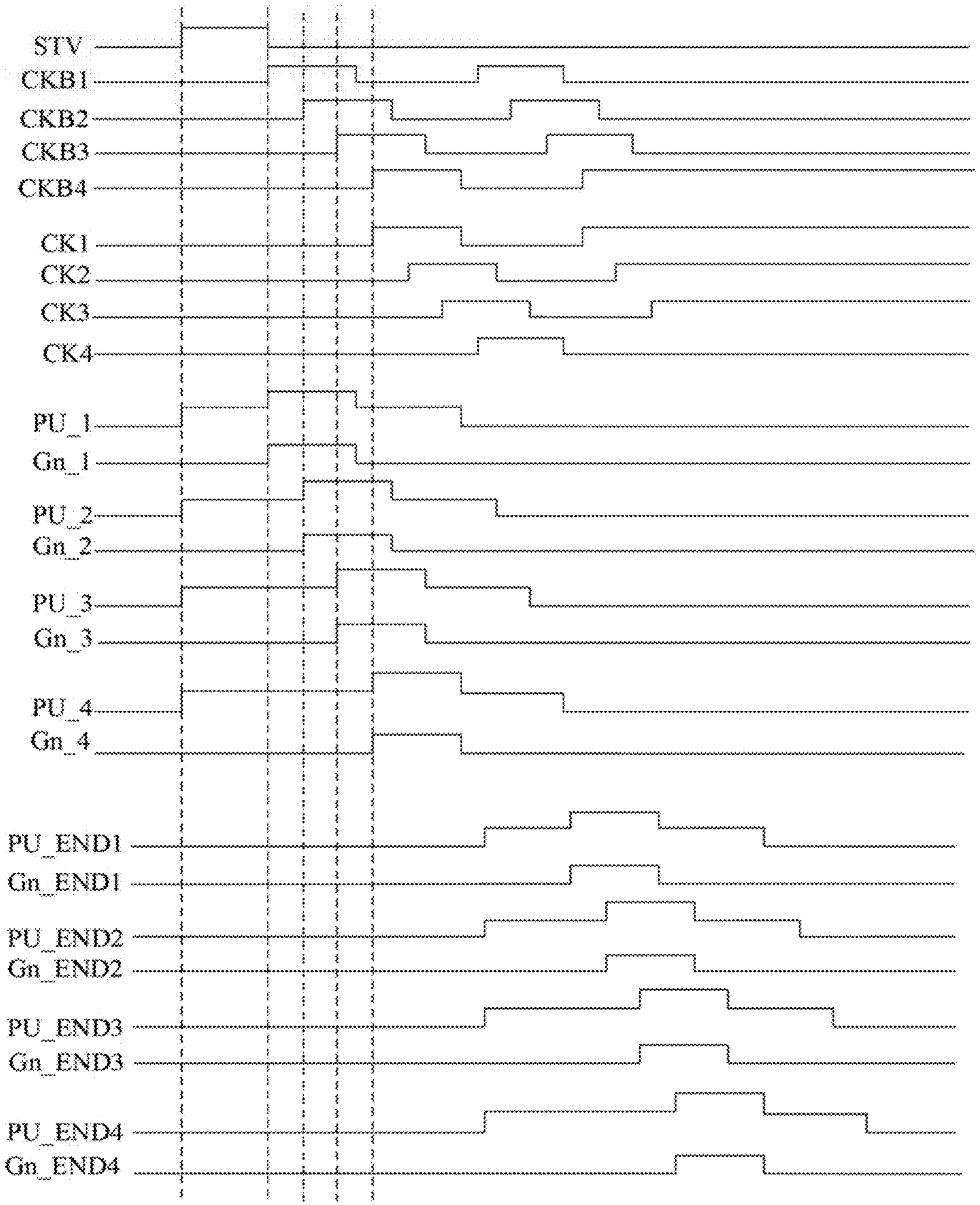
FIG. 17 illustrates another driving time sequence diagram of a display panel according to various embodiments of the present disclosure.

Based on same inventive concept, the present disclosure also provides a driving method of a display panel. Referring to FIGS. 15-17, FIG. 15 illustrates a driving time sequence diagram of a display panel according to various embodiments of the present disclosure; FIG. 16 illustrates another driving time sequence diagram of a display panel according to various embodiments of the present disclosure; and FIG. 17 illustrates another driving time sequence diagram of a display panel according to various embodiments of the present disclosure. The driving time sequence diagram of FIG. 15 corresponds to the display panel in FIG. 1, the driving time sequence diagram of FIG. 16 corresponds to the display panel in FIG. 3, and the driving time sequence diagram of FIG. 17 corresponds to the display panel in FIG. 4.

The driving method may include forward scanning or reverse scanning.

When scanning forward is performed, the pre-charging start time points of the shift registers ASG from the first level to the k-th level may be same; and when reverse scanning is performed, the pre-charging start time points of the shift registers ASG from the (n−k+1)-th level to the n-th level may be same.

The driving timing diagrams in FIGS. 15-17 are schematically illustrated by taking forward scanning as an example. Referring to FIGS. 15-17, PU_1 denotes the potential of the first node PU in the first level shift register ASG, Gn_1 denotes the output signal of the output terminal Gn of the first level shift register, PU_2 denotes the potential of the first node PU in the second level shift register ASG, Gn_2 denotes the output signal of the output terminal Gn of the second level shift register, PU_3 denotes the potential of the first node PU in the third level shift register ASG, Gn_3 denotes the output signal of the output terminal Gn of the third level shift register, PU_4 denotes the potential of the first node PU in the fourth level shift register ASG, and Gn_4 denotes the output signal of the output terminal Gn of the fourth level shift register. In FIG. 15, the potential start time point of the first node PU in the first level shift register ASG may be same as the potential start time point of the first node PU in the second level shift register ASG; that is, the pre-charging start time points of the first level to second level shift registers ASG may be same. In FIG. 16, the potential start time point of the first node PU in the first level shift register ASG, the potential start time point of the first node PU in the second level shift register ASG, and the potential start time point of the first node PU in the third level shift register ASG may be all same; that is, the pre-charging start time points of the first level to third level shift registers ASG may be same. In FIG. 17, the potential start time point of the first node PU in the first level shift register ASG, the potential start time point of the first node PU in the second level shift register ASG, the potential start time point of the first node PU in the third level shift register ASG, and the potential start time point of the first node PU in the fourth level shift register ASG may be all same; that is, the pre-charging start time points of the first level to fourth level shift registers ASG may be same. Similarly, during reverse scanning, the pre-charging start time points of the (n−k+1)-th level to n-th-level shift registers ASG may be same.

In one embodiment, during forward scanning, the pre-charging start time points of the first level to k-th-level shift registers ASG may be same, and the scan signals outputted by the output terminals Gn of the shift registers may remain unchanged; and during reverse scanning, the pre-charging start time points of the (n−k+1)-th level to n-th-level shift registers ASG may be same, and the scan signals outputted by the output terminals Gn of the shift registers may remain unchanged, which may not affect the pre-charging of the display panel.

Figure 18:
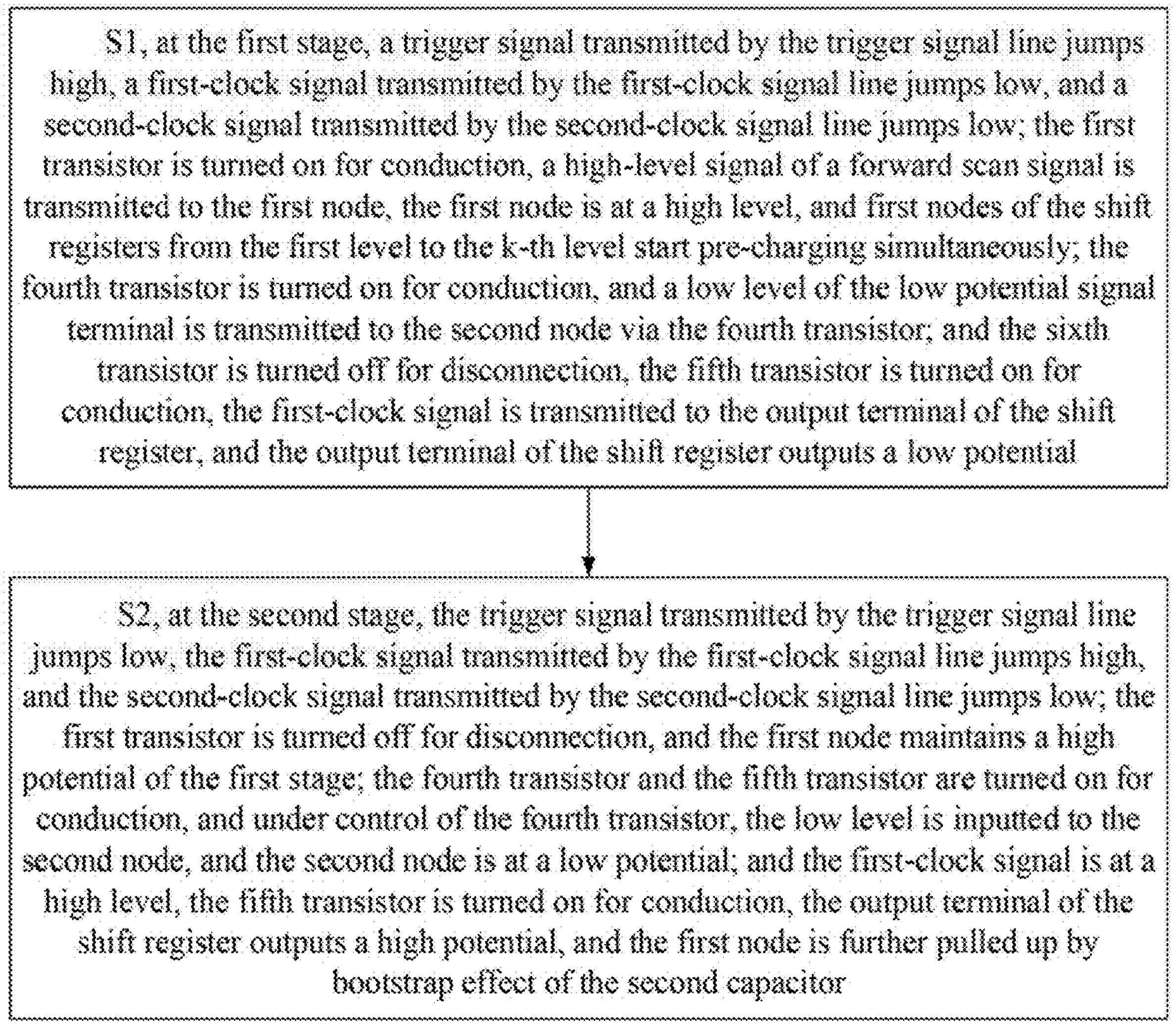
FIG. 18 illustrates a flowchart of a driving method of a display panel according to various embodiments of the present disclosure.

In some optional embodiments, referring to FIG. 18, FIG. 18 illustrates a flowchart of a driving method of a display panel according to various embodiments of the present disclosure. Referring to FIGS. 1, 3, 4, 12, 14, 15, 16 and 17, during forward scanning, the driving method may include at least a first stage and a second stage.

At S1 (the first stage), the trigger signal transmitted by the trigger signal line STV may jump high, the first-clock signal transmitted by the first-clock signal line CKB may jump low, and the second-clock signal transmitted by the second-clock signal line CK may jump low; the first transistor T0 may be turned on for conduction, the high-level signal of the forward scan signal may be transmitted to the first node PU, and the first node PU may be at a high level; the first nodes PU of the first level to k-th level shift register ASG may start pre-charging simultaneously; the fourth transistor T3 may be turned on for conduction, and the low level of the low potential signal terminal VGL may be transmitted to the second node PD via the fourth transistor T3; and the sixth transistor T5 may be turned off for disconnection, the fifth transistor T4 may be turned on for conduction, the first-clock signal may be transmitted to the output terminal Gn of the shift register, and the output terminal Gn of the shift register may output the low potential.

At S2 (the second stage), the trigger signal transmitted by the trigger signal line STV may jump low, the first-clock signal transmitted by the first-clock signal line CKB may jump high, and the second-clock signal transmitted by the second-clock signal line CK may jump low; the first transistor T0 may be turned off for disconnection, and the first node PU may maintain the high potential of the first level; the fourth transistor T3 and the fifth transistor T4 may be turned on for conduction; under the control of the fourth transistor T3, the low level may be inputted to the second node PD, and the second node PD may be at the low potential; and the first-clock signal may be high, the fifth transistor T4 may be turned on for conduction, the output terminal Gn of the shift register may output the high potential, and the bootstrap effect of the second capacitor C2 may further pull up the first node PU.

For example, the first stage may include a pre-charging process. At the first stage, in combination with FIGS. 12 and 15-17, the trigger signal transmitted by the trigger signal line STV may jump high, the first-clock signal transmitted by the first-clock signal line CKB may jump low, and the second-clock signal transmitted by the second-clock signal line CK may jump low. The trigger signal transmitted by the trigger signal line STV may jump high to control the first transistor T0 to be turned on for conduction, such that the high-level signal of the forward scan signal terminal DIR1 may be transmitted to the first node PU, and the first node PU may be at the high level. Since the trigger signal line STV is connected to the first level to k-th level shift registers ASG, the first nodes PU of the first level to k-th level shift registers ASG may start pre-charging. The high level of the first node PU may control the fourth transistor T3 to be turned on for conduction, the low level of the low potential signal terminal VGL may be transmitted to the second node PD via the fourth transistor T3, the low level may control the sixth transistor T5 to be turned off for disconnection, the first node PU may be the high level to control the fifth transistor T4 to be turned on for conduction, the first-clock signal on the first-clock signal line CKB may be transmitted to the output terminal Gn of the shift register, the output terminal Gn of the shift register may output the low potential. The first stage may realize simultaneous pre-charging of the first level to k-th level shift registers ASG, which may not affect the output of the low potential signals of the shift registers ASG.

At the second stage, the trigger signal transmitted by the trigger signal line STV may jump low, the first-clock signal transmitted by the first-clock signal line CKB may jump high, and the second-clock signal transmitted by the second-clock signal line CK may jump low. The trigger signal may jump low to control the first transistor T0 to be turned off for disconnection. Under the influence of the first capacitor C1, the first node PU may maintain the high potential of the first stage. The first node PU may be at the high potential, so that the fourth transistor T3 and the fifth transistor T4 may be still turned on for conduction. Under the control of the fourth transistor T3, the low level may be inputted to the second node PD, and the second node PD may be at the low potential. The first-clock signal transmitted by the first-clock signal line CKB may be high. Since the fifth transistor T4 is turned on at this point, the first-clock signal may be transmitted to the output terminal Gn of the shift register through the fifth transistor T4, and the output terminal Gn of the shift register may output the high potential. Obviously, at this point, due to the bootstrap effect of the second capacitor C2, the first node PU may be further pulled up.

In one embodiment, the shift register ASG may output the low potential in the first stage, and the shift register ASG may output the high potential in the second stage.

In some optional embodiments, referring to FIG. 19, FIG. 19 illustrates another flowchart of a driving method of a display panel according to various embodiments of the present disclosure. The driving method of the display panel in FIG. 19 may include the following exemplary steps.

At S1 (the first stage), the trigger signal transmitted by the trigger signal line STV may jump high, the first-clock signal transmitted by the first-clock signal line CKB may jump low, and the second-clock signal transmitted by the second-clock signal line CK may jump low; the first transistor T0 may be turned on for conduction, the high-level signal of the forward scan signal may be transmitted to the first node PU, and the first node PU may be at a high level; the first nodes PU of the first level to k-th level shift register ASG may start pre-charging simultaneously; the fourth transistor T3 may be turned on for conduction, and the low level of the low potential signal terminal VGL may be transmitted to the second node PD via the fourth transistor T3; and the sixth transistor T5 may be turned off for disconnection, the fifth transistor T4 may be turned on for conduction, the first-clock signal may be transmitted to the output terminal Gn of the shift register, and the output terminal Gn of the shift register may output the low potential.

At S2 (the second stage), the trigger signal transmitted by the trigger signal line STV may jump low, the first-clock signal transmitted by the first-clock signal line CKB may jump high, and the second-clock signal transmitted by the second-clock signal line CK may jump low; the first transistor T0 may be turned off for disconnection, and the first node PU may maintain the high potential of the first level; the fourth transistor T3 and the fifth transistor T4 may be turned on for conduction; under the control of the fourth transistor T3, the low level may be inputted to the second node PD, and the second node PD may be at the low potential; and the first-clock signal may be high, the fifth transistor T4 may be turned on for conduction, the output terminal Gn of the shift register may output the high potential, and the bootstrap effect of the second capacitor C2 may further pull up the first node PU.

At S3 (the third stage), the output terminal Gn of the next level shift register may jump high, the first-clock signal may jump low, the second-clock signal may jump high; the second transistor T1 may be turned on for conduction; the first node PU may write the low level of the reverse scan signal terminal DIR2; the fourth transistor T3 and the fifth transistor T4 may be turned off for disconnection, the first-clock signal may jump low, the second node PD may be low level through the coupling of the first capacitor C1; and the sixth transistor T5 may be turned off for disconnection, the second-clock signal may jump high, and the output terminal Gn of the shift register may output the low potential.

In one embodiment, after the second stage, the third stage may be also included. At the third stage, the output terminal Gn of next level shift register may jump high, the first-clock signal may jump low, and the second-clock signal may jump high. The output terminal Gn of next level shift register may jump high, the second transistor T1 may be turned on for conduction, and the reverse scan signal terminal DIR2 may be inputted by the low level, such that the first node PU may write the low level of the reverse scan signal terminal DIR2. The first node PU may be at the low level to control the fourth transistor T3 and the fifth transistor T4 to be turned off for disconnection. The first-clock signal may jump low, and the second node PD may be at the low level through the coupling of the first capacitor C1. The sixth transistor T5 may be turned off for disconnection, and the second-clock signal may jump high to control the seventh transistor T6 to be turned on for conduction. The low level of the low potential signal terminal VGL may be transmitted to the output terminal Gn of the shift register through the seventh transistor T6, and the output terminal Gn of the shift register may output the low potential.

In one embodiment, it may realize that the output terminal Gn of the shift register may output the low potential.

After the third stage, the output terminal Gn−1 of the previous level shift register and the output terminal Gn+1 of the next level shift register may both jump low, and the first-clock signal and the second-clock signal may have opposite phases.

The output terminal Gn−1 of the previous level shift register and the output terminal Gn+1 of the next level shift register may both jump low, the potential of the second nodes PD may maintain previous potential (both at the low potential), and the output terminals Gn of the shift registers may be always at the low potential. Therefore, the potential of the second node PD may not be extremely high by the bootstrap capacitor and may be always low. The first-clock signal may be coupled to the first node PU. When the first-clock signal is high and the second-clock signal is low, the potential of the first node PU may be high (coupled to the potential of the first-clock signal), the sixth transistor T5 may be turned on for conduction, the low potential of the low potential signal terminal VGL may be outputted to the output terminal Gn of the shift register, and the seventh transistor T6 may be at a turn-off state. When the first-clock signal is low and the second-clock signal is high, the first node PU may be also at the low potential due to the coupling of the first capacitor C1, and the sixth transistor T5 may be turned off for disconnection. However, the seventh transistor T6 may be turned on, and the seventh transistor T6 may output the low potential to the output terminal Gn of the shift register. That is, after the third stage, the output terminal Gn of the shift register may be always at the low potential, the second node PD may be always at the low potential, the potential of the first node PU may change with the first-clock signal, and the sixth transistor T5 and the seventh transistor T6 may be turned on alternately to output the low potential to the output terminal Gn of the shift register.

In some optional embodiments, referring to FIGS. 15, 16 and 17, k=2, 3 or 4, where when k=2, the first nodes of the first level to second level shift registers ASG may start pre-charging simultaneously; when k=3, the first nodes of the first level to third level shift registers ASG may start pre-charging simultaneously; and when k=4, the first nodes of the first level to fourth level shift registers ASG may start pre-charging simultaneously.

In FIG. 15, the potential start time point of the first node in the first level shift register ASG may be same as the potential start time point of the first node in the second level shift register ASG; that is, the pre-charging start time points of the first level to second level shift registers ASG may be same. In FIG. 16, the potential start time point of the first node in the first level shift register ASG, the potential start time point of the first node in the second level shift register ASG, and the potential start time point of the first node in the third level shift register ASG may be all same; that is, the pre-charging start time points of the first level to third level shift registers ASG may be same. In FIG. 17, the potential start time point of the first node in the first level shift register ASG, the potential start time point of the first node in the second level shift register ASG, the potential start time point of the first node in the third level shift register ASG, and the potential start time point of the first node in the fourth level shift register ASG may be all same; that is, the pre-charging start time points of the first level to fourth level shift registers ASG may be same.

It may be seen from above-mentioned embodiments that the present disclosure may at least achieve following beneficial effects.

In the display panel of the present disclosure, the first non-display region may be configured with the first-clock signal lines from the first first-clock signal line to the k-th first-clock signal line, and the second-clock signal lines from the first second-clock signal line to the k-th second-clock signal line; the first-clock signal lines from the first first-clock signal line to the k-th first-clock signal line may be electrically connected to the k levels of shift registers in sequence; the second-clock signal lines from the first second-clock signal line to the k-th second-clock signal line may be electrically connected to the k levels of shift registers in sequence. By sequentially generating the scan signals through the quantity k of first-clock signal lines and the quantity k of second-clock signal lines, the pre-charging time and charging time may be increased, and furthermore the pre-charging time of the pixels in the display region may be also increased, thereby improving the reliability of the display panel. One trigger signal line may be also configured in the first non-display region, and the trigger signal line may be electrically connected to the shift registers from the first level to the k-th level, and the shift registers from the (n−k+1)-th level to the n-th level. During forward scanning, the trigger signal line may send the trigger signal to the shift registers from the first level to the k-th level; during reverse scanning, the trigger signal line may send the trigger signal to the shift registers from the (n−k+1)-th level to the n-th level; and the shift registers may send the scan signals to the scan lines. In the existing technology, when the quantity k of first-clock signal lines and the quantity k of second-clock signal lines are configured, equal quantity of trigger signal lines may be needed, that is, the quantity k of trigger signal lines may be needed. Since the quantity k of trigger signal lines occupy the space of the first non-display region, it is not beneficial for the narrow frame of the first non-display region. Only one trigger signal line is configured in the first non-display region in the present disclosure. Therefore, the space may be further saved, and the first non-display region may be reduced to achieve narrow frame. The present disclosure may achieve narrow frame under the premise of ensuring pre-charging and charging time.

For the driving method of the display panel of the present disclosure, when scanning forward is performed, the pre-charging start time points of the shift registers from the first level to the k-th level may be same; and when reverse scanning is performed, the pre-charging start time points of the shift registers from the (n−k+1)-th level to the n-th level may be same, thereby ensuring that the scan signals outputted from the output terminals of the shift registers, from the first level to the k-th level, may be outputted in sequence; and the durations of the outputted scan signals may be not affected. The present disclosure may only need one trigger signal line to trigger the shift register.

Although some specific embodiments of the present disclosure have been described in detail through examples, it should be understood by those skilled in the art that above examples may be for illustration only and may be not intended to limit the scope of the present disclosure. It should be understood by those skilled in the art that above embodiments may be modified without departing from the scope and spirit of the present disclosure. The scope of the present disclosure may be defined by appended claims.

What is claimed is:

1. A display panel, comprising:

a display region and a non-display region at least partially surrounding the display region, wherein:

the display region includes a plurality of scan lines;

the non-display region includes a first non-display region; and the first non-display region includes a trigger signal line, a plurality of first-clock signal lines from a first first-clock signal line to a k-th first-clock signal line, a plurality of second-clock signal lines from a first second-clock signal line to a k-th second-clock signal line, and n levels of cascaded shift registers;

output terminals of the n levels of cascaded shift registers are electrically connected to the plurality of scan lines in a one-to-one correspondence, and an output terminal of an m-th-level shift register of the n levels of cascaded shift registers is electrically connected to a first terminal of an (m+k)-th-level shift register of the n levels of cascaded shift registers;

the plurality of first-clock signal lines from the first first-clock signal line to the k-th first-clock signal line is electrically connected to k levels of shift registers, of the n levels of cascaded shift registers, in sequence, respectively;

the plurality of second-clock signal lines from the first second-clock signal line to the k-th second-clock signal line is electrically connected to the k levels of shift registers in sequence, respectively; and the trigger signal line is electrically connected to shift registers from a first level to a k-th level of the n levels of cascaded shift registers and shift registers from an (n−k+1)-th level to an n-th-level of the n levels of cascaded shift registers, wherein k is a positive integer greater than or equal to 1, n is a positive integer greater than k, m is a positive integer greater than or equal to 1, and m+k≤n.

2. The display panel according to claim 1, wherein: k=2, 3 or 4.

3. The display panel according to claim 1, wherein: the trigger signal line is directly and electrically connected to the shift registers from the first level to the k-th level and the shift registers from the (n−k+1)-th level to the n-th level.

4. The display panel according to claim 1, wherein: a first-clock signal line, a second-clock signal line and the trigger signal line are arranged along a first direction and extend along a second direction, wherein the first direction intersects the second direction; and along the first direction, the trigger signal line is between the second-clock signal line and a shift register, and the trigger signal line is on a side of the second-clock signal line away from the first-clock signal line; or the trigger signal line, a first-clock signal line, a second-clock signal line are arranged along a first direction and extend along a second direction; and along the first direction, the second-clock signal line is between the first-clock signal line and a shift register, and the trigger signal line is on a side of the first-clock signal line away from the second-clock signal line.

5. The display panel according to claim 4, wherein:

the first-clock signal line is electrically connected to the shift register through a first connection line; the second-clock signal line is electrically connected to the shift register through a second connection line; the trigger signal line is directly and electrically connected to the shift register through a third connection line; and the first connection line, the second connection line, and the third connection line extend along the first direction.

6. The display panel according to claim 5, wherein:

the trigger signal line and the third connection line are at a same film layer.

7. The display panel according to claim 5, wherein:

the trigger signal line is at a different film layer from the first connection line and the second connection line.

8. The display panel according to claim 5, wherein:

the third connection line is respectively connected to a first end and a second end of the trigger signal line; the third connection line includes a first portion and a quantity k of second portions; the first portion extends along the first direction; one end of the first portion is electrically connected to the trigger signal line; a second portion extends along the second direction; and one end of the second portion is connected to the first portion, and another end of the second portion is connected to the shift register, wherein:

for the third connection line connected to the first end of the trigger signal line, the quantity k of second portions are respectively connected to the shift registers from the first level to the k-th level; and for the third connection line connected to the second end of the trigger signal line, the quantity k of second portions are respectively connected to the shift registers from the (n−k+1)-th level to the n-th level.

9. The display panel according to claim 1, wherein:

a shift register of the n levels of cascaded shift registers includes:

a first transistor, wherein a control terminal of the first transistor is electrically connected to an output terminal of a previous level shift register, a first terminal of the first transistor is electrically connected to a forward scan signal terminal, and a second end of the first transistor is electrically connected to a first node;

a second transistor, wherein a control terminal of the second transistor is electrically connected to an output terminal of a next level shift register, a first terminal of the second transistor is electrically connected to a reverse scan signal terminal, and a second terminal of the second transistor is electrically connected to the first node;

a third transistor, wherein a control terminal of the third transistor is electrically connected to a second node, a first terminal of the third transistor is electrically connected to a low potential signal terminal, and a second terminal of the third transistor is electrically connected to the first node;

a fourth transistor, wherein a control terminal of the fourth transistor is electrically connected to the first node, a first terminal of the fourth transistor is electrically connected to the second node, and a second terminal of the fourth transistor is electrically connected to the low potential signal terminal;

a fifth transistor, wherein a control terminal of the fifth transistor is electrically connected to the first node and a first capacitor, a first terminal of the fifth transistor is electrically connected to a first-clock signal line, and a second terminal of the fifth transistor is electrically connected to an output terminal of the shift register;

a second capacitor, electrically connected to the first-clock signal line and the second node respectively;

a sixth transistor, wherein a control terminal of the sixth transistor is electrically connected to the second node, a first terminal of the sixth transistor is electrically connected to the output terminal of the shift register and the first capacitor, and a second terminal of the sixth transistor is electrically connected to the low potential signal terminal;

a seventh transistor, wherein a control terminal of the seventh transistor is electrically connected to a second-clock signal line, a first terminal of the seventh transistor is electrically connected to the output terminal of the shift register, and a second terminal of the seventh transistor is electrically connected to the low potential signal terminal;

an eighth transistor, wherein a control terminal of the eighth transistor is electrically connected to a reset signal terminal, a first terminal of the eighth transistor is electrically connected to the first node, and a second terminal of the eighth transistor is electrically connected to the low potential signal terminal; and a ninth transistor, wherein a control terminal of the ninth transistor is electrically connected to the reset signal terminal, a first terminal of the ninth transistor is electrically connected to the output terminal of the shift register, and a second terminal of the ninth transistor is electrically connected to the low potential signal terminal.

10. The display panel according to claim 9, wherein:

control terminals of the first transistors of the shift registers from the first level to the k-th level and the shift registers from the (n−k+1)-th level to the n-th level are electrically connected to the trigger signal line.

11. The display panel according to claim 1, wherein:

a shift register of the n levels of cascaded shift registers includes:

a first diode, wherein an input terminal of the first diode is electrically connected to an output terminal of a previous level shift register, and an output terminal of the first diode is electrically connected to a first node;

a second transistor, wherein a control terminal of the second transistor is electrically connected to an output terminal of a next level shift register, a first terminal of the second transistor is electrically connected to a low potential signal terminal, and a second terminal of the second transistor is electrically connected to the first node;

a third transistor, wherein a control terminal of the third transistor is electrically connected to a second node, a first terminal of the third transistor is electrically connected to the low potential signal terminal, and a second terminal of the third transistor is electrically connected to the first node;

a fourth transistor, wherein a control terminal of the fourth transistor is electrically connected to the first node, a first terminal of the fourth transistor is electrically connected to the second node, and a second terminal of the fourth transistor is electrically connected to the low potential signal terminal;

a fifth transistor, wherein a control terminal of the fifth transistor is electrically connected to the first node and a first capacitor, a first terminal of the fifth transistor is electrically connected to a first-clock signal line, and the second terminal of the fifth transistor is electrically connected to an output terminal of the shift register;

a second capacitor, electrically connected to the first-clock signal line and the second node respectively;

a sixth transistor, wherein a control terminal of the sixth transistor is electrically connected to the second node, a first terminal of the sixth transistor is electrically connected to the output terminal of the shift register and the first capacitor, and a second terminal of the sixth transistor is electrically connected to the low potential signal terminal;

a seventh transistor, wherein a control terminal of the seventh transistor is electrically connected to a second-clock signal line, a first terminal of the seventh transistor is electrically connected to the output terminal of the shift register, and a second terminal of the seventh transistor is electrically connected to the low potential signal terminal;

an eighth transistor, wherein a control terminal of the eighth transistor is electrically connected to a reset signal terminal, a first terminal of the eighth transistor is electrically connected to the first node, and a second terminal of the eighth transistor is electrically connected to the low potential signal terminal; and a ninth transistor, wherein a control terminal of the ninth transistor is electrically connected to the reset signal terminal, a first terminal of the ninth transistor is electrically connected to the output terminal of the shift register, and a second terminal of the ninth transistor is electrically connected to the low potential signal terminal.

12. The display panel according to claim 1, wherein:

the non-display region further includes a second non-display region arranged along the first direction and opposite to the first non-display region; and at the second non-display region, the first direction is an extending direction of the scan line;

the second non-display region includes a trigger signal line, a plurality of first-clock signal lines from a first first-clock signal line to a k-th first-clock signal line, a plurality of second-clock signal lines from a first second-clock signal line to a k-th second-clock signal line, and n levels of cascaded shift registers; output terminals of the n levels of cascaded shift registers are electrically connected to the plurality of scan lines in a one-to-one correspondence, and an output terminal of an m-th-level shift register is electrically connected to a first terminal of an (m+k)-th-level shift register; the plurality of first-clock signal lines from the first first-clock signal line to the k-th first-clock signal line is connected to k levels of shift registers in sequence, respectively; the plurality of second-clock signal lines from the first second-clock signal line to the k-th second-clock signal line is connected to the k levels of shift registers in sequence, respectively; and the trigger signal line is connected to shift registers from a first level to a k-th level and shift registers from an (n−k+1)-th level to an n-th-level; and an output terminal of an i-th-level shift register is electrically connected to an i-th scan line, and an output terminal of an i-th-level shift register in the first non-display region is also electrically connected to the i-th scan line, wherein i is a positive integer greater than or equal to k and less than or equal to n.

13. A driving method of a display panel, wherein the display panel includes a display region and a non-display region at least partially surrounding the display region, wherein the display region includes a plurality of scan lines; the non-display region includes a trigger signal line, a plurality of first-clock signal lines from a first first-clock signal line to a k-th first-clock signal line, a plurality of second-clock signal lines from a first second-clock signal line to a k-th second-clock signal line, and n levels of cascaded shift registers; output terminals of the n levels of cascaded shift registers are electrically connected to the plurality of scan lines in a one-to-one correspondence, and an output terminal of an m-th-level shift register of the n levels of cascaded shift registers is electrically connected to a first terminal of an (m+k)-th-level shift register of the n levels of cascaded shift registers; the plurality of first-clock signal lines from the first first-clock signal line to the k-th first-clock signal line is connected to k levels of shift registers of the n levels of cascaded shift registers in sequence, respectively; the plurality of second-clock signal lines from the first second-clock signal line to the k-th second-clock signal line is connected to the k levels of shift registers in sequence, respectively; and the trigger signal line is connected to shift registers from a first level to a k-th level of the n levels of cascaded shift registers and shift registers from an (n−k+1)-th level to an n-th-level of the n levels of cascaded shift registers, wherein k is a positive integer greater than or equal to 1, n is a positive integer greater than k, m is a positive integer greater than or equal to 1, and m+k≤n; and the method comprising:

forward scanning or reverse scanning, wherein during the forward scanning, pre-charging start time points of the shift registers from the first level to the k-th level are same; and during the reverse scanning, pre-charging start time points of the shift registers from the (n−k+1)-th level to the n-th level are same.

14. The driving method according to claim 13, wherein:

a shift register of the n levels of cascaded shift registers includes a first transistor, wherein a control terminal of the first transistor is electrically connected to an output terminal of a previous level shift register, a first terminal of the first transistor is electrically connected to a forward scan signal terminal, and a second terminal of the first transistor is electrically connected to a first node; a second transistor, wherein a control terminal of the second transistor is electrically connected to an output terminal of a next level shift register, a first terminal of the second transistor is electrically connected to a reverse scan signal terminal, and a second terminal of the second transistor is electrically connected to the first node; a third transistor, wherein a control terminal of the third transistor is electrically connected to a second node, a first terminal of the third transistor is electrically connected to a low potential signal terminal, and a second terminal of the third transistor is electrically connected to the first node; a fourth transistor, wherein a control terminal of the fourth transistor is electrically connected to the first node, a first terminal of the fourth transistor is electrically connected to the second node, and a second terminal of the fourth transistor is electrically connected to the low potential signal terminal; a fifth transistor, wherein a control terminal of the fifth transistor is electrically connected to the first node and a first capacitor, a first terminal of the fifth transistor is electrically connected to a first-clock signal line, and a second terminal of the fifth transistor is electrically connected to an output terminal of the shift register; a second capacitor, electrically connected to the first-clock signal line and the second node respectively; a sixth transistor, wherein a control terminal of the sixth transistor is electrically connected to the second node, a first terminal of the sixth transistor is electrically connected to the output terminal of the shift register and the first capacitor, and a second terminal of the sixth transistor is electrically connected to the low potential signal terminal; a seventh transistor, wherein a control terminal of the seventh transistor is electrically connected to a second-clock signal line, a first terminal of the seventh transistor is electrically connected to the output terminal of the shift register, and a second terminal of the seventh transistor is electrically connected to the low potential signal terminal; an eighth transistor, wherein a control terminal of the eighth transistor is electrically connected to a reset signal terminal, a first terminal of the eighth transistor is electrically connected to the first node, and a second terminal of the eighth transistor is electrically connected to the low potential signal terminal; and a ninth transistor, wherein a control terminal of the ninth transistor is electrically connected to the reset signal terminal, a first terminal of the ninth transistor is electrically connected to the output terminal of the shift register, and a second terminal of the ninth transistor is electrically connected to the low potential signal terminal;

control terminals of the first transistors of the shift registers from the first level to the k-th level and the shift registers from the (n−k+1)-th level to the n-th level are electrically connected to the trigger signal line; and during the forward scanning, the driving method at least includes a first stage and a second stage, wherein:

at the first stage, a trigger signal transmitted by the trigger signal line jumps high, a first-clock signal transmitted by the first-clock signal line jumps low, and a second-clock signal transmitted by the second-clock signal line jumps low; the first transistor is turned on for conduction, a high-level signal of a forward scan signal is transmitted to the first node, the first node is at a high level, and first nodes of the shift registers from the first level to the k-th level start pre-charging simultaneously; the fourth transistor is turned on for conduction, and a low level of the low potential signal terminal is transmitted to the second node via the fourth transistor; and the sixth transistor is turned off for disconnection, the fifth transistor is turned on for conduction, the first-clock signal is transmitted to the output terminal of the shift register, and the output terminal of the shift register outputs a low potential; and at the second stage, the trigger signal transmitted by the trigger signal line jumps low, the first-clock signal transmitted by the first-clock signal line jumps high, and the second-clock signal transmitted by the second-clock signal line jumps low; the first transistor is turned off for disconnection, and the first node maintains a high potential of the first stage; the fourth transistor and the fifth transistor are turned on for conduction, and under control of the fourth transistor, the low level is inputted to the second node, and the second node is at a low potential; and the first-clock signal is at a high level, the fifth transistor is turned on for conduction, the output terminal of the shift register outputs a high potential, and the first node is further pulled up by bootstrap effect of the second capacitor.

15. The driving method according to claim 14, further including:

a third stage after the second stage, wherein an output terminal of the next level shift register jumps high, the first-clock signal jumps low, and the second-clock signal jumps high; the second transistor is turned on for conduction, and a low level of the reverse scan signal terminal is written into the first node; the fourth transistor and the fifth transistor are turned off for disconnection, the first-clock signal jumps low, the second node is at the low level through coupling of the first capacitor; and the sixth transistor is turned off for disconnection, the second-clock signal jumps high, and the output terminal of the shift register outputs a low potential.

16. The driving method according to claim 14, wherein:

k=2, 3 or 4, wherein when k=2, first nodes of the shift registers from the first level to a second level start pre-charging simultaneously; when k=3, first nodes of the shift registers from the first level to a third level start pre-charging simultaneously; and when k=4, first nodes of the shift registers from the first level to a fourth level start pre-charging.

* * * * *